US00RE37470B1

(19) United States
(12) Reissued Patent
Ohkura et al.

(10) Patent Number: US RE37,470 E
(45) Date of Reissued Patent: Dec. 18, 2001

(54) SUBSTRATE PROCESSING APPARATUS AND SUBSTRATE PROCESSING METHOD

(75) Inventors: Jun Ohkura; Naruaki Iida, both of Kumamoto; Hiroyuki Kudou, Kikuchi-gun; Masanori Tateyama, Kumamoto; Yasuhiro Sakamoto, Kamoto-gun, all of (JP)

(73) Assignee: Tokyo Electron Limited, Tokyo (JP)

(21) Appl. No.: 09/388,589

(22) Filed: Sep. 2, 1999

Related U.S. Patent Documents

Reissue of:
(64) Patent No.: 5,664,254
Issued: Sep. 2, 1997
Appl. No.: 08/594,937
Filed: Jan. 31, 1996

(30) Foreign Application Priority Data

Feb. 2, 1995 (JP) ..... 7-039254
Feb. 9, 1995 (JP) ..... 7-046413

(51) Int. Cl.[7] ..... G03D 5/00
(52) U.S. Cl. ..... 396/604; 396/611; 396/612; 396/624; 414/225; 414/940; 414/152; 414/222.13; 118/500
(58) Field of Search ..... 396/604, 611, 396/624; 118/52, 54, 316, 319, 320, 500, 719; 414/416, 225, 939, 937, 935, 786, 749, 940, 941, 152, 222.13; 250/492.11, 492.21

(56) References Cited

U.S. PATENT DOCUMENTS 4,985,722 * 1/1991 Ushijima et al. ..... 396/612
5,061,144 * 10/1991 Akimoto et al. ..... 414/225
5,151,008 * 9/1992 Ishida et al. ..... 414/744.5
5,177,514 * 1/1993 Ushijima et al. ..... 396/624
5,202,716 * 4/1993 Takeyama et al. ..... 396/612
5,297,910 * 3/1994 Yoshioka et al. ..... 414/225
5,339,128 * 8/1994 Takeyama et al. ..... 396/604
5,364,222 * 11/1994 Akimoto et al. ..... 414/416
5,382,803 * 1/1995 Asakawa ..... 250/492.21
5,418,382 * 5/1995 Blackwood et al. ..... 250/561
5,430,271 * 7/1995 Orgami et al. ..... 414/152
5,442,416 * 8/1995 Tateyama et al. ..... 396/612
5,466,945 * 11/1995 Brickell et al. ..... 250/559.12
5,564,889 * 10/1996 Araki ..... 414/786
5,851,296 * 12/1998 Haraguchi et al. ..... 414/786

* cited by examiner

*Primary Examiner*—D. Rutledge
(74) *Attorney, Agent, or Firm*—Oblon, Spivak, McClelland, Maier & Neustadt, P.C.

(57) ABSTRACT

A wafer processing apparatus includes a common path, extending in a Y-axis direction, in which one wafer or a plurality of wafers are conveyed, a plurality of process units stacked on both sides of the common path to constitute multi-stage structures, a main handler moved in the common path in the Y-axis direction and rotated about a Z axis at an angle θ to load/unload the wafer into/from the process units, an arm section arranged to move in the main handler in the Z-axis direction, a plurality of holding arms arranged in the arm section to constitute a multi-stage structure so as to respectively hold the wafers, each holding arm being advanced and retreated on an X-Y plane from the arm section, an optical sensor, arranged in the arm section, for detecting a holding state of the wafer in each of the plurality of holding arms, and a controller for controlling an operation of the main handler, an operation of the arm section, and operations of the plurality of holding arms on the basis of a detection result from the optical sensor, wherein the controller advances or retreats each holding arm while operating at least one of the main handler and the arm section, and causes the optical sensor to detect the holding state of the wafer by each holding arm before the holding arm reaches a corresponding one of the process units.

16 Claims, 18 Drawing Sheets

SUBSTRATE PROCESSING APPARATUS AND SUBSTRATE PROCESSING METHOD

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to substrate processing apparatus and a substrate processing apparatus for processing a substrate such as a semiconductor wafer.

2. Description of the Related Art

In a photolithography process in manufacturing a semiconductor device, a resist coating process for coating a resist on a wafer and a developing process for developing a coated resist after an exposure process. These processes are simultaneously performed by using a composite process system described in, e.g., U.S. Pat. No. 5,339,128. This system comprises a main handler for conveying a wafer, and is designed such that a wafer W is loaded by the main handler from a cassette station into a process section, the wafer W are exchanged between process chambers in the process section, and the above processes are performed.

A conventional handler has an arm section driven by three axes (Y axis, Z axis, and θ rotation axis), and the arm section a plurality of holding arms driven by only the X axis. All the 4-axis drive operations in the main handler are independently (individually) performed. For example, the arm section of the main handler moves in the Y-axis direction first, moves in the Z-axis direction, and then rotated at the angle θ. Finally, the holding arms move in the X-axis direction to receive a wafer.

In recent years, a demand for an increase in a throughput for a resist coating/developing process system is strong. For this reason, in order to answer this demand, the main handler must be operated at a speed as high as possible in a process section. However, since the 4-axis drive operations in the X-axis direction, Y-axis direction, Z-axis direction, and θ-rotation-axis direction are independently performed in the conventional main handler, the speed of the main handler operation is limited to a certain speed. The main handler performs sequential operations, e.g., the start of moving in the Y-axis direction, the end of the moving of the Y-axis direction, the start of moving in the Z-axis direction, the end of the moving of the Z-axis direction, the start of moving in the θ-rotation-axis direction, the end of the moving of the θ-rotation-axis direction, the start of moving in the X-axis direction, and the end of the moving of the X-axis direction. Therefore, a time from when the main handler reaches a target point to when the main handler receive a wafer is too long so that it is very difficult to increase the throughput.

In addition, when each drive system employs a high-speed drive mechanism to more increase the operation of the main handler, an excessive load acts on the mechanism, its durability and reliability may be degraded. In addition, when the operation speed of each drive system is increased, a noticeable amount of particle is generated, the wafer is contaminated by attaching particle on the wafer, and a yield may be decreased.

When a resist solution such as polyimide having a high viscosity is used in a resist coating process, even after a side rinse process in a coating device, the resist is not completely removed from the wafer peripheral portion, and the resist may be partially left on the wafer peripheral portion. When the residual resist is attached to the holding arms of the main handler, the wafer W is easily removed from the holding arms, and the wafer W cannot be smoothly conveyed. For this reason, the contact area between the wafer peripheral portion and the holding arms shall be minimized.

In a conventional method of conveying a wafer, independently of the distance between a main handler and a target point, the main handler is moved at a constant acceleration and a constant deceleration. For this reason, the distance between the main handler and the target point is long, the torque of a servo motor instantaneously, excessively varies at the start of the servo motor, vibration from the servo motor may be transmitted to the main handler. When the main handler vibrates, the contact state between the holding arms and the wafer W changes, and resist residue easily moves to the holding arms.

In a process using a resist solution having a low viscosity, it may be impossible to perform a side rinse process. For this reason, a wafer W on which a resist is coated is conveyed, the resist is attached to the holding arms due to vibration. This attached resist is dried soon and removed from the holding arms, thereby generating particles. In this manner, the wafer is contaminated by the particles, and a production yield is decreased.

SUMMARY OF THE INVENTION

It is an object of the present invention to provide a substrate processing apparatus and a substrate processing method in which a substrate can be conveyed as a whole within a short time without causing an excessive load to act on each drive mechanism to increase a throughput and to suppress generation of particles.

It is another object of the present invention to provide a substrate processing apparatus and a substrate processing method in which vibration generated during convey of a substrate can be suppressed, and a convey method can be selected depending on the conditions of the substrate.

According to the present invention, there is provided to a substrate processing apparatus for performing a plurality of processes to a substrate comprising:

a common path, extending in a Y-axis direction, in which one substrate or a plurality of substrates are conveyed;

a plurality of process units stacked on both sides of the common path to constitute multi-stage structures;

a main handler moved in the common path in the Y-axis direction and rotated about a Z axis at an angle θ to load/unload the substrate into/from the process units;

an arm section arranged to move in the main handler in the Z-axis direction;

a plurality of holding arms arranged in the arm section to constitute a multi-stage structure so as to respectively hold the substrates, each holding arm being advanced and retreated on an X-Y plane from the arm section;

detection means, arranged in the arm section, for detecting a holding state of the substrate held in each of the plurality of holding arms; and control means for controlling an operation of the main handler, an operation of the arm section, and operations of the plurality of holding arms on the basis of a detection result from the detection means, wherein the control means advances or retreats each holding arm while operating at least one of the main handler and the arm section, and causes the detection means to detect the holding state of the substrate held by each holding arm before the holding arm reaches a corresponding one of the process units.

The main handler, the arm section and the holding arms of the above apparatus various multi-axis synchronous drive operations such as (1) to (3) can be executed.

(1) A synchronous operation of Z-axis direction moving/θ rotation is started, X-axis direction moving is started, a synchronous operation of Z-axis direction moving/θ rotation is completed, and the X-axis direction moving is completed.

(2) Z-axis direction moving is started first, θ rotation is started, and a synchronous operation of Z-axis direction moving/θ rotation is completed.

(3) θ rotation is started first, Z-axis direction moving is started, and a synchronous operation of Z-axis direction moving/θ rotation.

In each of all the operations, a time required to convey a wafer is shorter than that in the conventional sequential operations. A whole convey time can be adjusted to a longer one of a time required for Z-axis direction moving and a time required for θ rotation. In this manner, the wafer can be rapidly conveyed at a rated moving speed within a time shorter than a time required in the conventional operation. Furthermore, an amount of particle generation can be suppressed.

A period of time until a substrate intrudes into an interference area of the process unit such as the target point, the holding arms can be synchronously advanced and retreated during moving of the main handler. For this reason, a time required to convey a substrate by the main handler can be shortened, and a throughput increases.

When the holding arms are advanced and retreated while the main handler moves in the Z-axis direction, it can be detected and checked whether the substrate is held by the holding arms. On an early stage before the next step, so that held wafer can be checked in advance. A trouble can be prevented.

In case of using two upper and lower holding arms arranged on each other, when the upper and lower arms are synchronously driven to cause the advance operation period of the upper arm to overlap the retreat operation period of the lower arm, a processed substrate stored in the processing apparatus in advance can be rapidly replaced with an unprocessed substrate (including not only an unprocessed substrate but also a substrate processed in the previous step) held by the holder member.

In addition, at this time, a notched opening is formed in the support portion of each holding arm. For this reason, when the upper and lower arms overlap, it can be detected through the opening of one holding arm whether the other holding arm holds a substrate.

According to the present invention, there is provided to a substrate processing method comprises, the steps of;

(a) step of loading a substrate from a cassette station into a process section;

(b) first moving step of causing a holding arm to hold the substrate, moving the substrate in a Y-axis direction along a common path in the process section, moving the substrate in a Z-axis direction, and rotating the substrate about a Z axis at an angle θ;

(c) second moving step of loading the substrate into a process unit;

(d) third moving step of unloading the processed substrate from the process unit; and (e) step of unloading the substrate from the process section to the cassette station.

In the process (b), a holding state of the substrate by the holding arm is preferably changed depending on the type of a process in one process unit, and a convey speed at which the substrate is conveyed from the process unit into another process unit is preferably changed. In the step (b), an acceleration and a deceleration at which the substrate is moved is preferably changed depending on a moving distance of the substrate. In addition, in the step (c), when the substrate is transferred from the holding arm onto a mounting table in the process unit, the downward moving speed of the arm section is preferably decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Preferred embodiments of the present invention will be described below with reference to the accompanying drawings.

Figure 1:
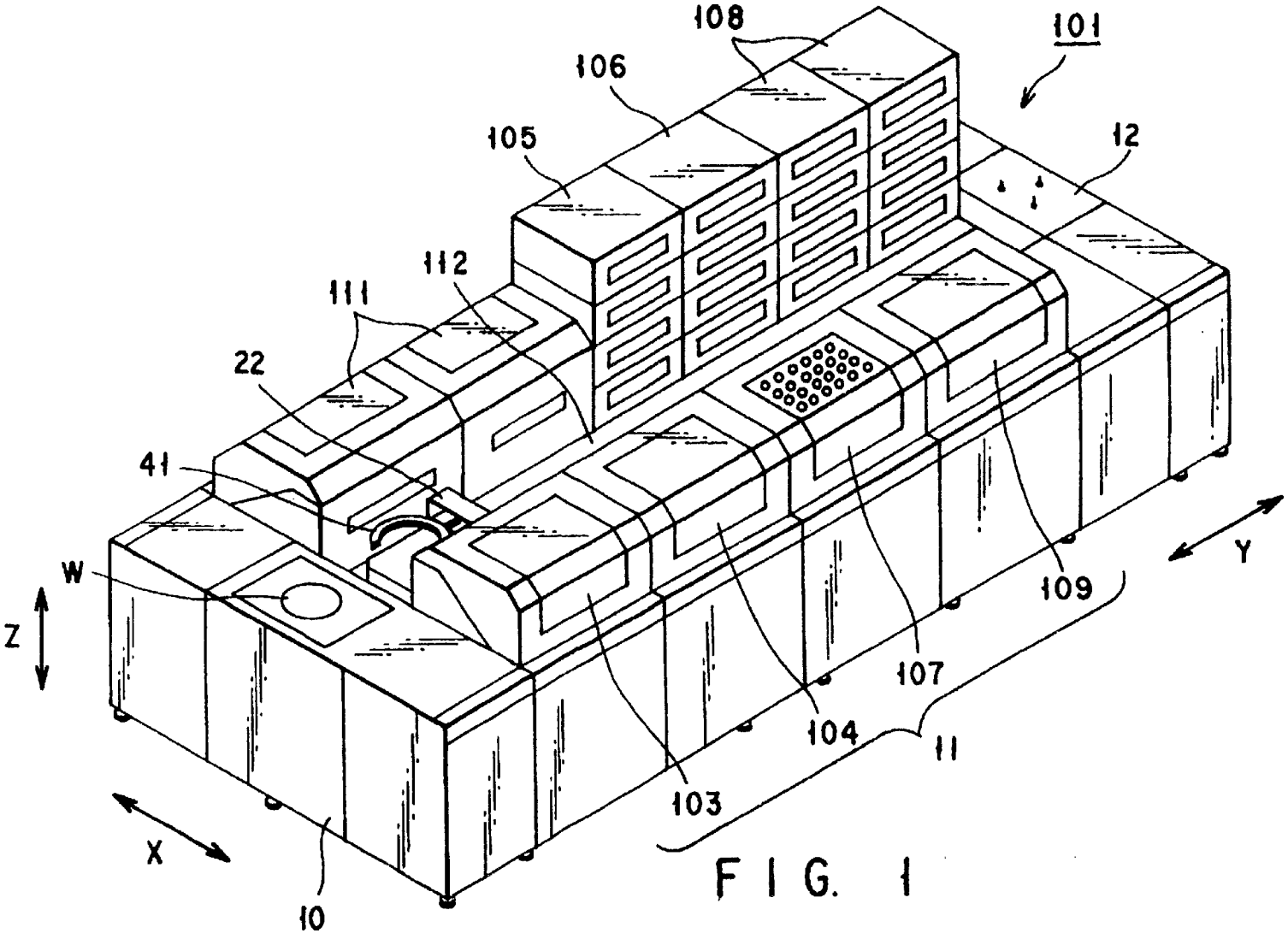
FIG. 1 is a perspective view showing the entire outline of a resist coating/developing process system.

As shown in FIG. 1, a process section 11 of a resist coating/developing process system 101 is arranged between a cassette station 10 and an interface section 12. The process section 11 comprises a central path 112, a brush-washing unit 103, a jet-water-washing unit 104, an adhesion unit 105, a cooling unit 106, a resist coating unit 107, a heating unit 108, a peripheral exposure unit 109, and a developing unit 111. These process units 103 to 111 are arranged on both the sides of the central path 112. The wafer outlet/inlet port of each of the units 103 to 111 faces the central path 112. The central path 112 extends, in the longitudinal direction (Y-axis direction) of the system 101, from the cassette station 10 to the interface section 12. A main handler 22 is arranged such that the main handler 22 can move in the central path 112.

A cassette station 102 comprises a first sub-handler 21. The first sub-handler 21 is designed to get a wafer W in and out of a cassette CR and to give the wafer W to a main handler 22.

The interface section 12 comprises a second sub-handler 24. The second sub-handler 24 is designed to receive the wafer W from the main handler 22 and load the wafer into an exposure process section (not shown). Note that the operations of the main handler 22 and the first and second sub-handlers 21 and 24 are controlled by a controller 90.

The brush-washing unit 103 is designed to brush-wash the wafer W. The jet-water-washing unit 104 is designed to wash the wafer W with high-pressure jet water. The adhesion unit 105 is designed to perform a hydrophobic process (adhesion process) to the surface of the wafer W in order to improve the fixing state of a resist. The cooling unit 106 is designed to cool the wafer W. The resist coating unit 107 is designed to coat a resist solution on the wafer W. The heating unit 108 is designed to perform a heating process to the wafer W before and after resist coating. The peripheral exposure unit 109 is designed to remove the resist from the peripheral portion of the wafer W. The developing unit 111 is designed to develop the exposed wafer W with a developing solution.

The process units in the system will be further described with reference to FIGS. 2 to 4.

In the cassette station 10, a cassette placing table 20 having four positioning projections 20a. Cassettes CR are positioned by the positioning projections 20a to respectively have openings facing the process section 11. These wafer cassettes CR are aligned in the X-axis direction.

The first sub-handler 21 is arranged between the cassette placing table 20 and the process section 11. The first sub-handler 21 comprises drive mechanisms (not shown) in the X- and Y-axis directions, and is designed to selectively access the cassette wafers CR. The first sub-handler 21 comprises a drive mechanism for θ rotation, and is designed to also access alignment unit (ALIM) and an extension unit (EXT) (to be described later).

In the process section 11, the large number of process units 103 to 111 are arranged. Of these process units, the adhesion unit 105, the cooling unit 106, and the heating unit 108 are arranged to respectively constitute multi-stage structures. In addition, the brush-washing unit 103, the jet-water-washing unit 104, the resist coating unit 107, the peripheral exposure unit 109, and the developing unit 111 are arranged to respectively constitute two-stage structures.

Figure 3:
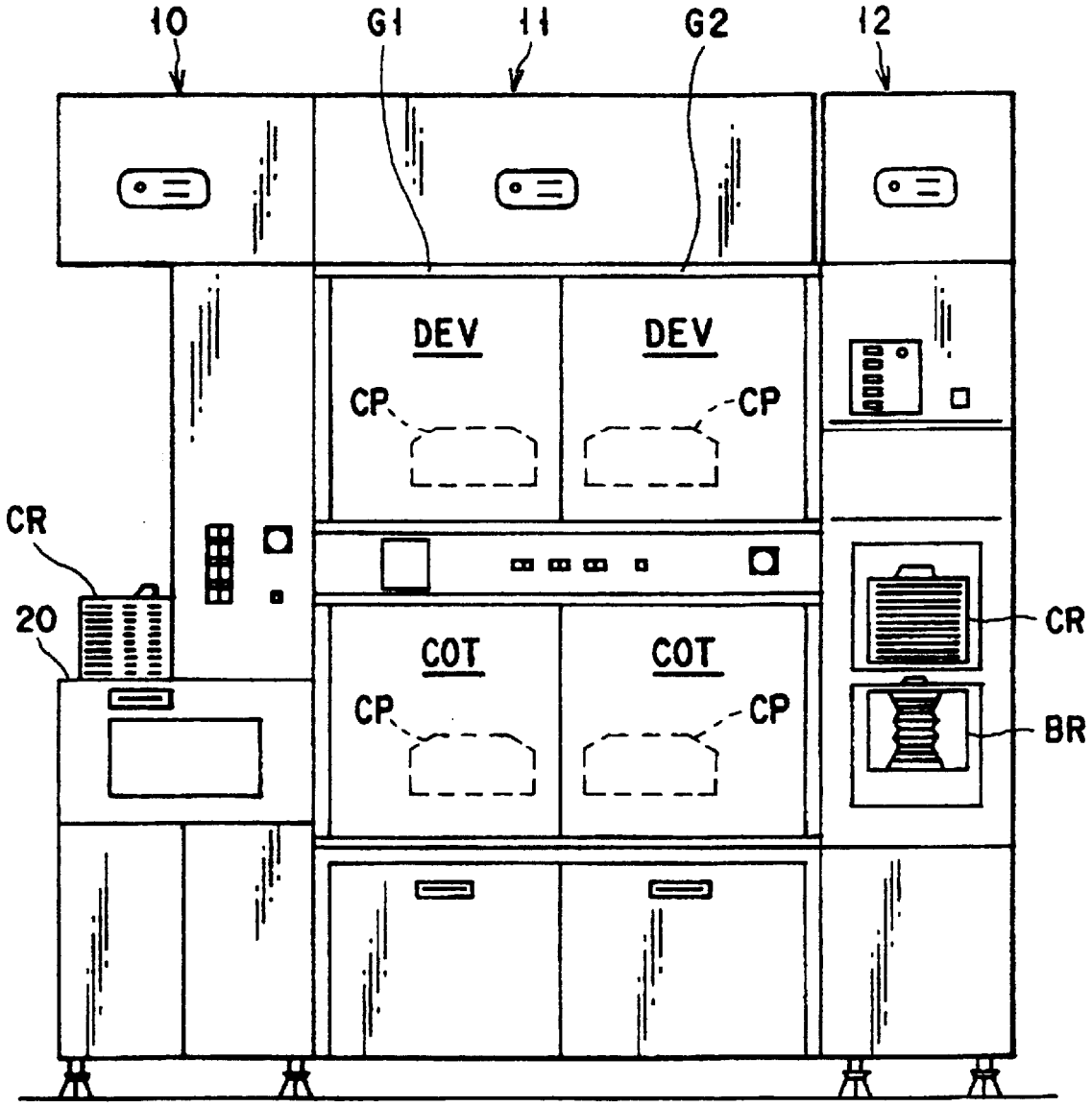
FIG. 3 is a plan view showing the coating/developing process system.
Figure 4:
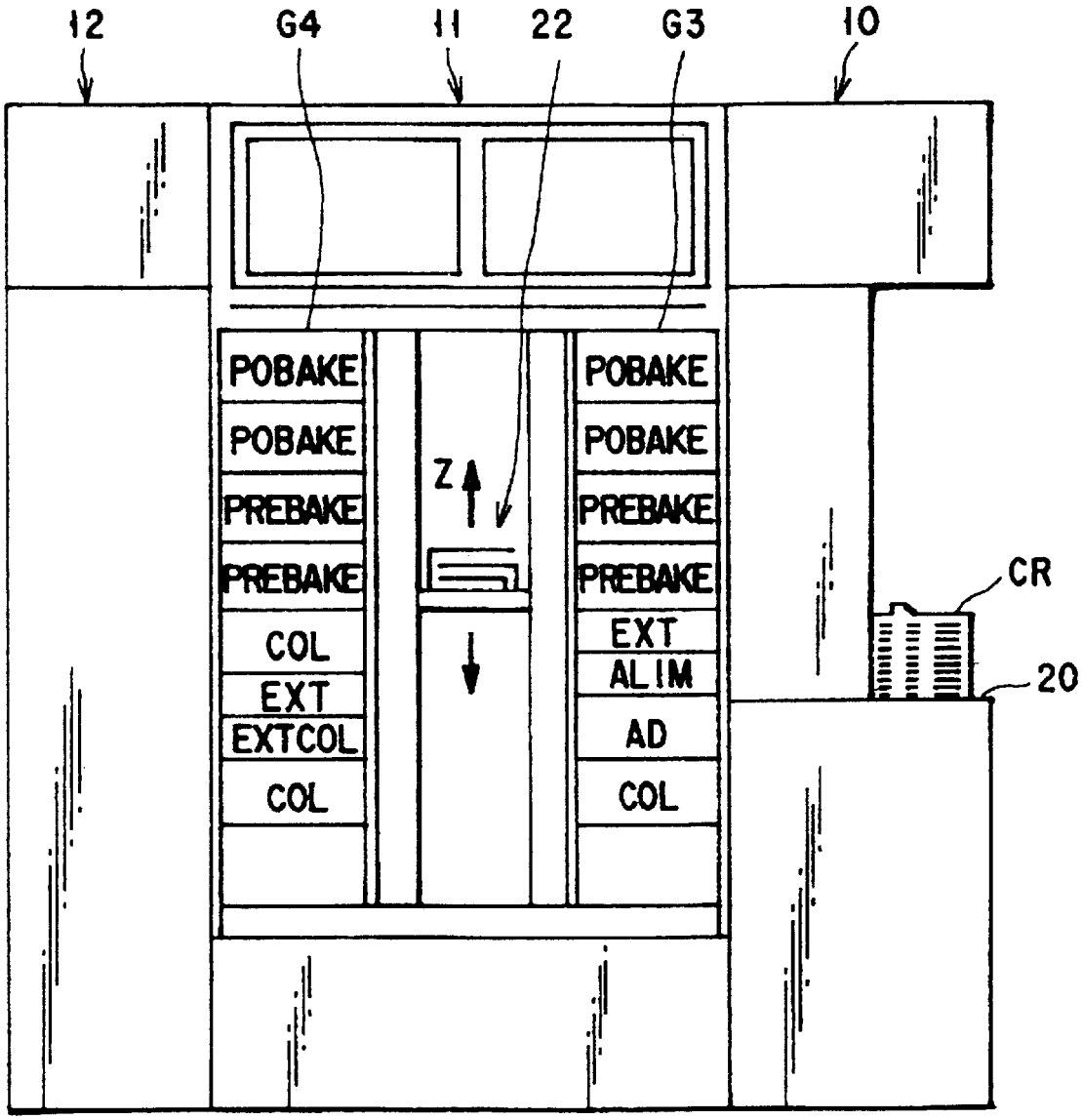
FIG. 4 is a rear view showing the coating/developing process system.

In this embodiment, as shown in FIGS. 3 and 4, the process section 11 comprises five process unit groups $G_1$, $G_2$, $G_3$, $G_4$, and $G_5$. The first and second multi-stage process unit groups $G_1$ and $G_2$ are arranged on the front surface side of the system, the third multi-stage process unit group $G_3$ is arranged adjacent to the cassette station 10, the fourth multi-stage process unit group $G_4$ is arranged adjacent to the interface section 12, and the fifth multi-stage process unit group $G_5$ is arranged on the rear surface side of the system.

As shown in FIG. 3, in the first process unit group $G_1$, as two spinner type process units for placing a wafer W on a spin chuck and performing a process to the wafer in a cap CP, a resist coating unit (COT) and a developing unit (DEV) are stacked in this order. In the second process unit group $G_2$, two spinner type process units, a resist coating unit (COT) and a developing unit (DEV) are stacked in this order. In each of the resist coating units (COT) are preferably arranged as lower stages because exhaust of the resist solution is mechanically cumbersome in maintenance.

As shown in FIG. 4, in the third process unit group $G_3$, open type process units for placing a wafer W on a placing plate SP and performing a predetermined process to the wafer W, a cooling unit (COL), an adhesion unit (AD), an alignment unit (ALIM), an extension unit (EXT), a prebaking unit (PREBAKE), and a post-baking unit (POBAKE) are sequentially stacked in this order to constitute an 8-stage structure. In the fourth process unit group $G_4$, open type process units, a cooling unit (COL), an extension/cooling unit (EXTCOL), an extension unit (EXT), a cooling unit (COL), a prebaking unit (PREBAKE), and a post-baking unit (POBAKE) are sequentially stacked in this order to constitute an 8-stage structure.

As described above, the cooling unit (COL) and extension/cooling unit (EXTCOL) having low process temperatures are arranged as the lower stages, the prebaking unit (PREBAKE), the post-baking unit (POBAKE), and the adhesion unit (AD) are arranged as upper stages. For this reason, thermal mutual interference between the units can be reduced.

The interface section 12 has a dimension equal to that of the process section 11 in the depth direction (X-axis direction) and a dimension different from that of the process section 11 in the width direction. On the front portion of the interface section 12, a portable pickup cassette CR and a buffer cassette BR are arranged to constitute two stages. On the other hand, a peripheral exposure device 23 is arranged on the rear surface portion of the interface section 12, and a second sub-handler 24 is arranged on the central portion of the interface section 12.

The second sub-handler 24 comprises an X-axis drive mechanism and a Z-axis drive mechanism, and is designed to move in the X- and Y-axis directions and to access both the cassettes CR and BR and the peripheral exposure device 23. In addition, the second sub-handler 24 also comprises a θ-rotation drive mechanism, and is designed to access the extension unit (EXT) belonging to the process unit group $G_4$ and a wafer exchange table (not shown) on the exposure device adjacent to the second sub-handler 24.

Figure 2:
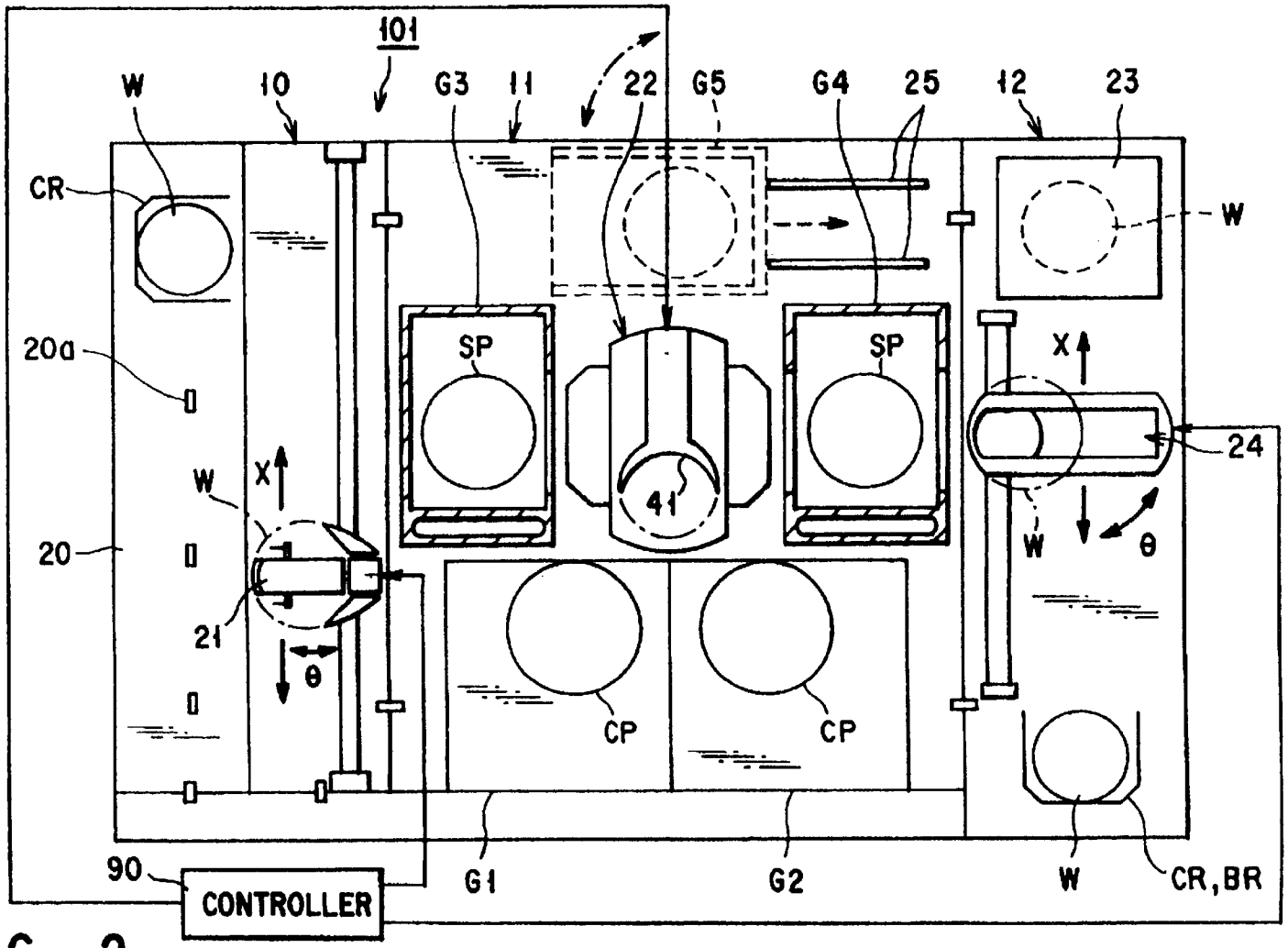
FIG. 2 is a block plan view showing a resist processing device according to the first embodiment of the present invention.

The process unit group $G_5$ indicated by a broken line in FIG. 2 can be arranged on the rear surface side of the main handler 22. The process unit group $G_5$ is arranged slidable along a guide rail 25, and can be shifted in the side direction when viewed from the main handler 22. Since a space can be assured by shifting the process unit group $G_5$, the main handler 22 can be subjected to maintenance checking from the rear side of the main handler 22. Note that the process unit group $G_5$ is not only linearly slide-shifted along the guide rail 25, but also pivotally shifted out of the system as indicated by an alternate long and short dash line in FIG. 2.

A main handler according to the first embodiment of the present invention will be described below with reference to FIGS. 5 to 10.

The casing of the main handler 22 is constituted by a cylindrical support member 33, and an arm section 34 is arranged in the cylindrical support member 33 such that the arm section 34 can be vertically moved in the Z-axis direction. The cylindrical support member 33 comprises a pair of vertical wall portions 31 and 32 which are connected to each other at the upper and lower ends and opposite to each other.

Figure 6:
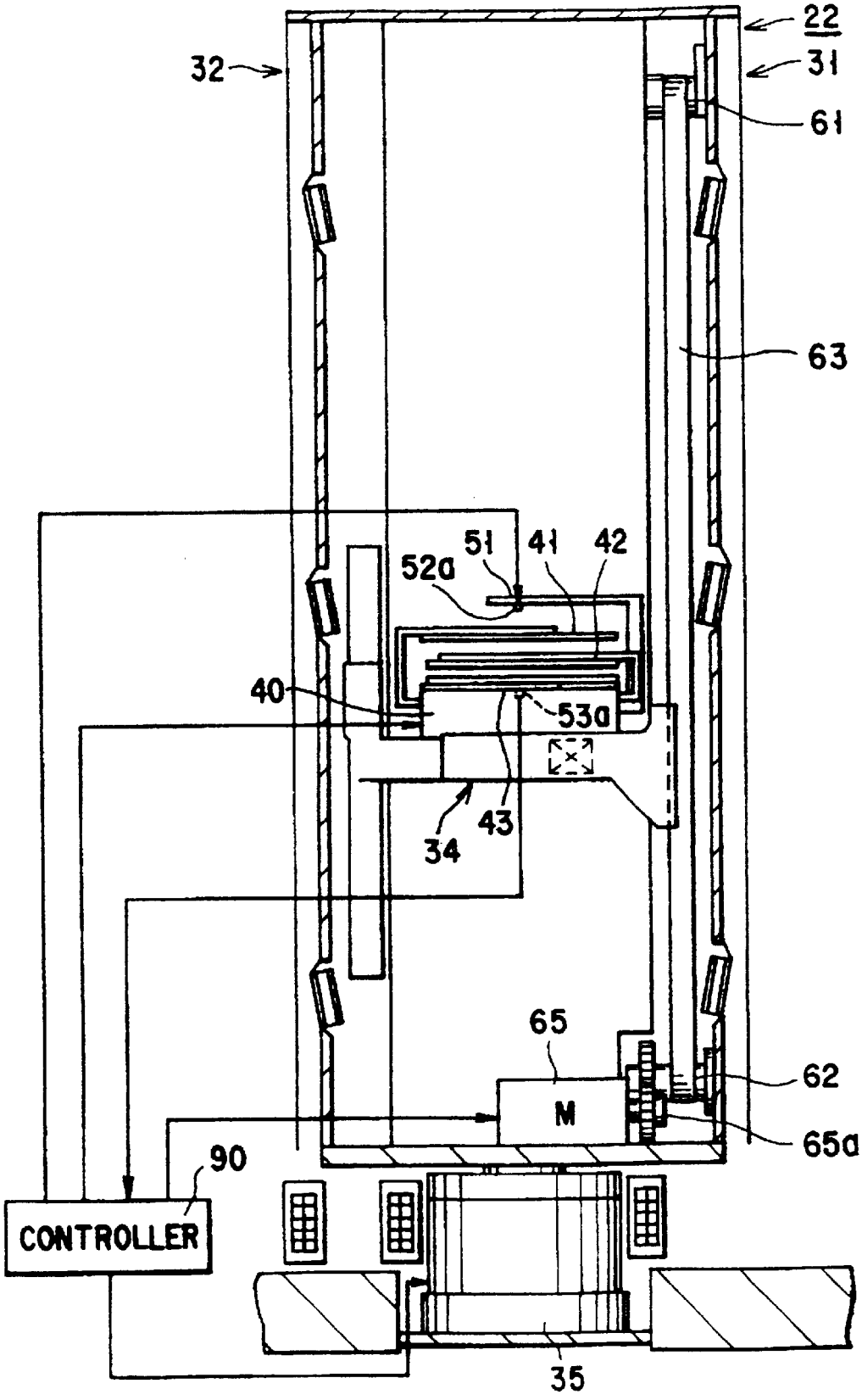
FIG. 6 is a block sectional view showing the main handler.

As shown in FIG. 6, the cylindrical support member 33 is connected to the vertical drive shaft of a motor 35. When the cylindrical support member 33 is rotated about the vertical drive shaft, the arm section 34 is rotated together with the cylindrical support member 33, thereby rotating the arm section 34 about the Z axis at an angle θ. Note that the cylindrical support member 33 may be constituted to be connected to another rotating shaft (not shown) rotated by the motor 35.

The arm section 34 comprises a convey base 40 and three holding arms 41, 42, and 43. The three holding arms 41, 42, and 43 are vertically arranged on the convey base 40 to constitute a 3-stage structure, and extend in the X-axis direction. Each of the holding arms 41, 42, and 43 has a shape and a size which can passes through a side opening 36 between both the vertical wall portions 31 and 32 of the cylindrical support member 33. Note that the holding arms 41, 42, and 43 are designed to move in the X-axis direction by a drive motor (not shown) and a belt (not shown) which are incorporated in the convey base 40.

Figure 5:
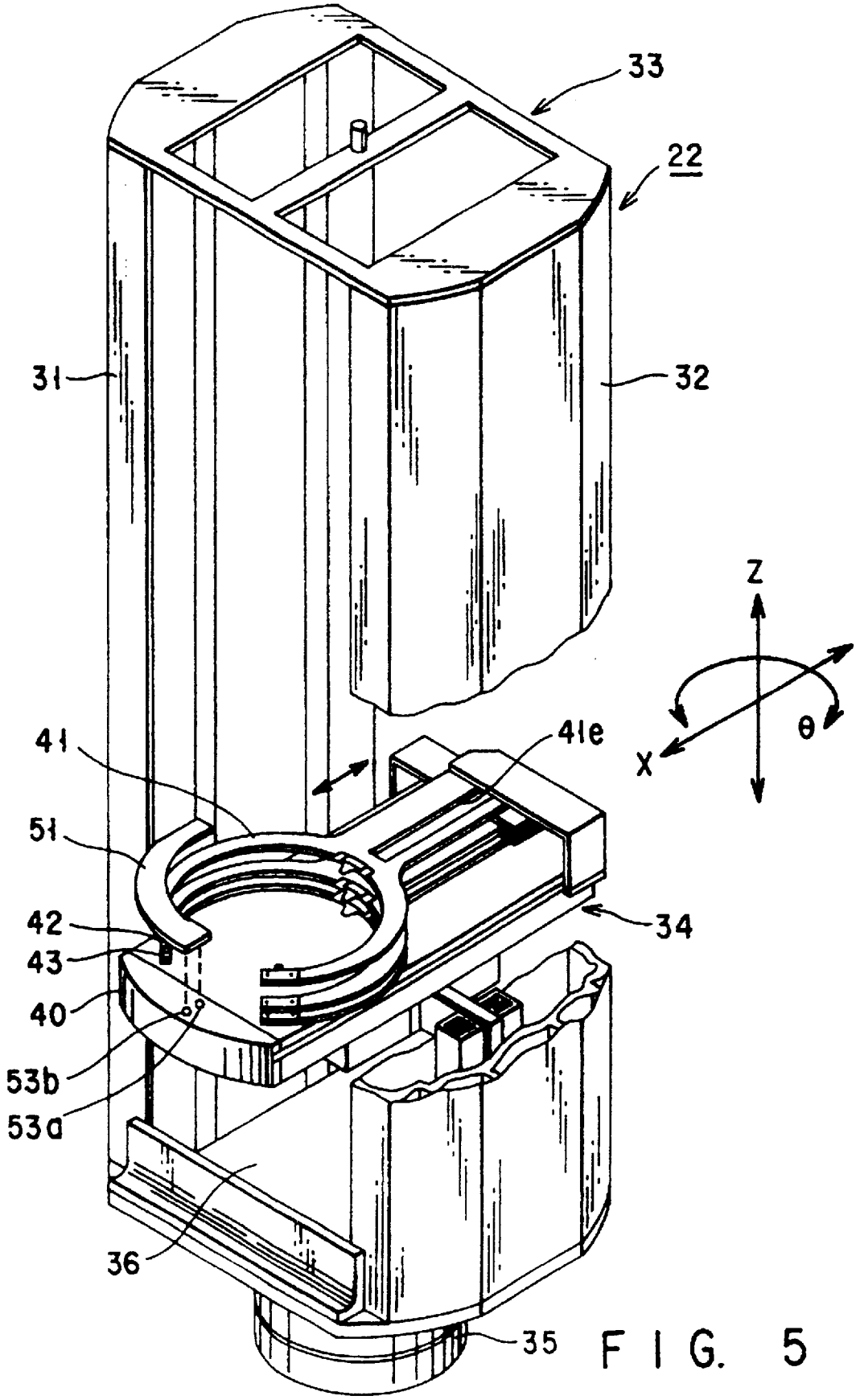
FIG. 5 is a partially cutaway perspective view showing a main handler.
Figure 7:
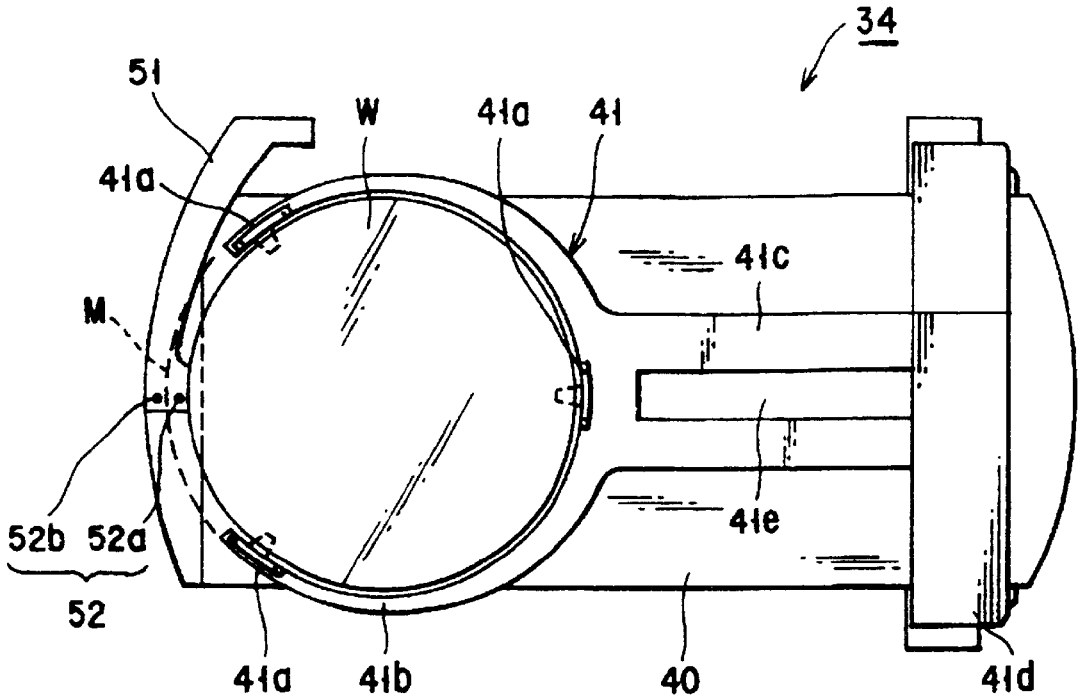
FIG. 7 is a plan view showing an arm section of the main handler.
Figure 8:
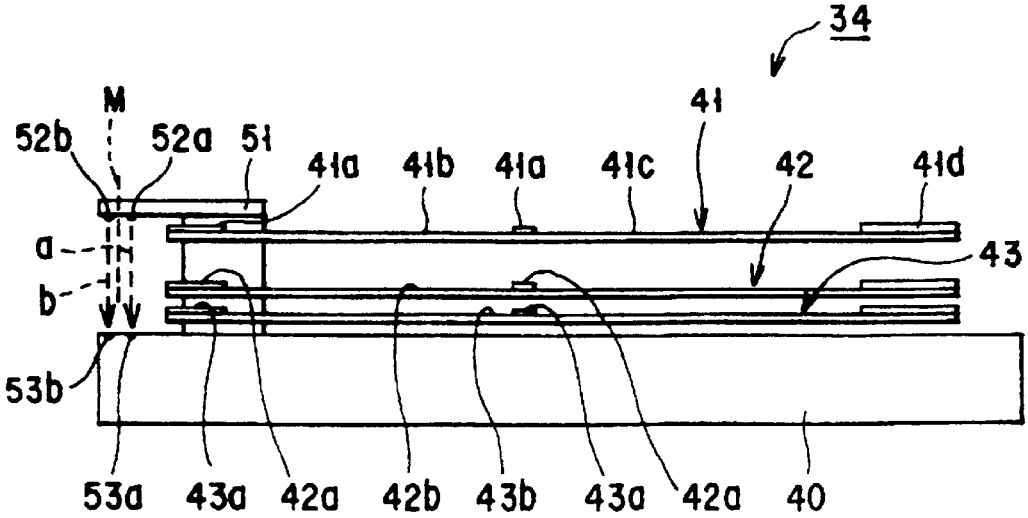
FIG. 8 is a side view showing the arm section of the main handler.

The holding arms 41, 42, and 43 substantially have the same arrangements. The arrangement of the holding arm 41 located at the uppermost portion will be representatively described. The holding arm 41, as shown in FIGS. 5, 7, and 8, comprises three support members 41a for directly supporting the peripheral portion of a wafer W, a holder member 41b, having an almost ¾-annular shape, for holding these support members 41a, and an arm member 41c for supporting the holder member 41b. Note that the holding arm 41 is designed to entirely move when a stay 41d arranged on the arm member 41c is slid.

As shown in FIG. 7, a rectangular long hole 41e is formed in the arm member 41c. Light-emitting portions 52a and 52b of a sensor 52 are located on the forward extended line in the longitudinal direction of the long hole 41e.

The X-axis drive mechanisms of the holding arms 41, 42, and 43 are variously controlled by the controller 90 backed up by a computer system. For example, the X-axis drive mechanisms may be controlled such that the second holding arm 42 is advanced during retreat of the first holding arm 41, or the X-axis drive mechanisms may be controlled such that in the second holding arm 42 is advanced to a wafer detection position in an early stage of an advancing operation of the second holding arm 42, and, thereafter, the second holding arm 42 is further advanced depending on a wafer detection result or is kept stopped.

As shown in FIG. 8, the interval between the first holding arm 41 located at the uppermost portion and the second holding arm 42 at the middle portion is larger than the interval between the second holding arm 42 and the third holding arm 43 at the lowermost portion. This is because thermal interference between the wafer W held by the first holding arm 41 and the wafer W held by the second holding arm 42 is made as small as possible. Therefore, the first holding arm 41 is desirably used from the cooling step to the resist coating step, and the second and third holding arms 42 and 43 are desirably used in the steps in which the wafers W are not adversely affected by thermal interference. Note that, in order to further improve the thermal interference prevention effect, a heat insulator may be arranged between the first holding arm 41 and the second holding arm 42.

As shown in FIGS. 5 to 8, a sensor stand 51 is arranged on the convey base 40, and light-emitting portions 52a and 52b for emitting a laser beam are attached to the almost tip portion of the sensor stand 51. The sensor 52 has the light-emitting portion 52a and light-receiving portion 53a of the first sensor and the light-emitting portion 52b and light-receiving portion 53b of the second sensor. The light emitting portion 52a and light-receiving portion 53a of the first sensor are to detect the presence/absence of the wafer W in the holder member 41b (42b, 43b). The light-emitting portion 52b and light-receiving portion 53b of the second sensor are arranged outside the light emitting portion 52a and light-receiving portion 53a of the first sensor to detect whether the wafer W is held at a predetermined position of the holder member 41b (42b, 43b) (whether the wafer sticks out of the predetermined position).

The sensor 52 is connected to the controller 90. The controller 90 checks on the basis of a detection signal from the sensor 52 whether each of the holding arms 41, 42, and 43 holds the wafer W (the presence/absence of wafer holding), and checks whether the wafer W is held at correct positions.

An operation of detecting a wafer W by the sensor 52 will be described below with reference to FIGS. 7 and 8.

When the holding arm 41 (42, 43) advances (retreats), and the front edge portion of the wafer W advances to a position (position indicated by a broken line M in FIGS. 7 and 8) between an optical axis a and an optical axis b, laser beams are emitted from the light-emitting portions 52a and 52b, respectively. When the optical axis a is shielded by the wafer W, it is determined that the holding arm 41 (42, 43) holds the wafer W. At the same time, when the optical axis b is shielded by the wafer W, the wafer W is correctly held by the holding arm 41 (42, 43) without sticking out of the holding arm 41 (42, 43).

Figure 9:
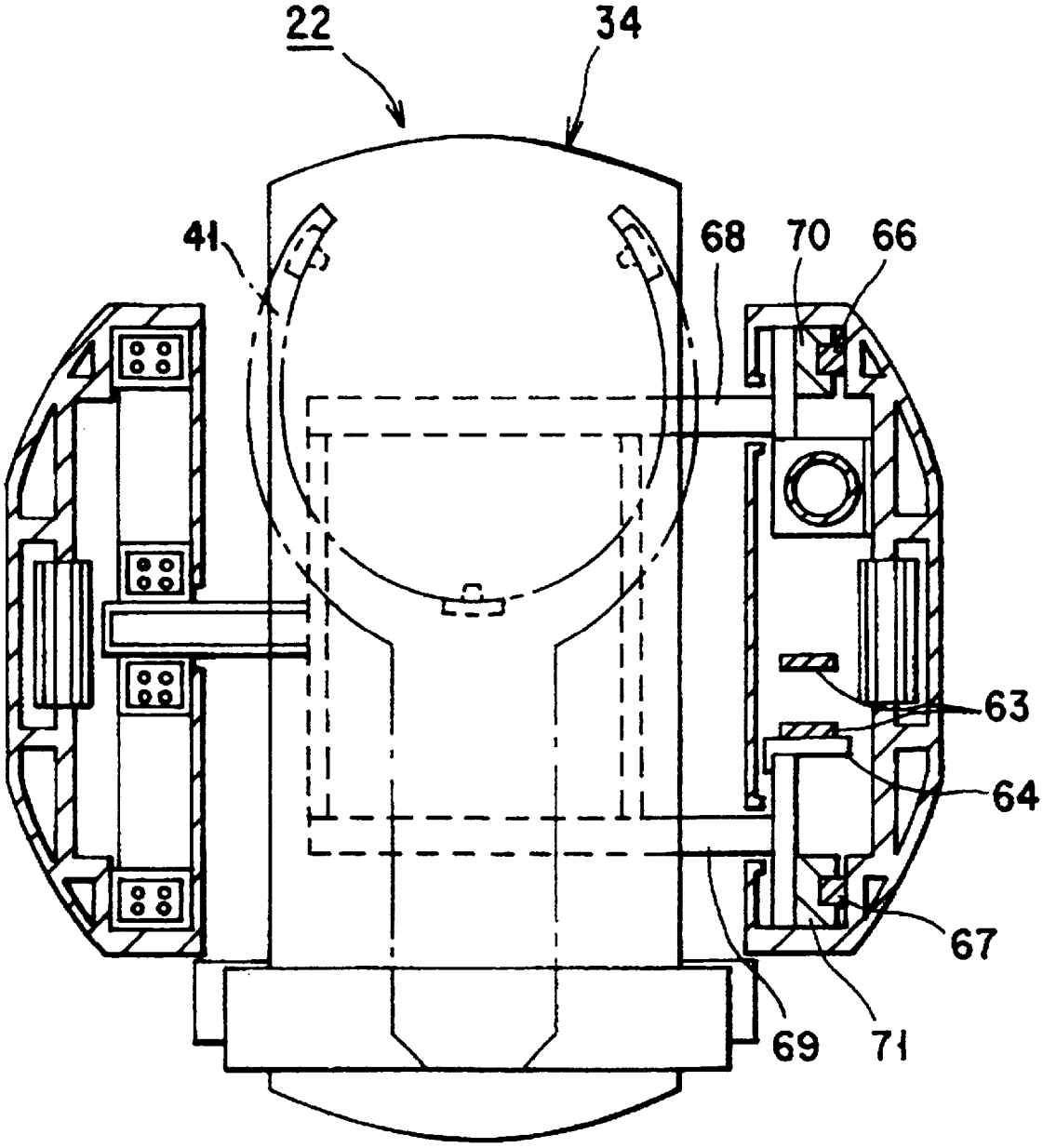
FIG. 9 is a sectional view showing a drive mechanism of the arm section of the main handler.

A Z-axis drive mechanism for vertically moving the arm section 34 of the main handler 22 will be described below with reference to FIGS. 9 and 10.

A driven pulley 61 is arranged near the upper end portion in the vertical wall portion 31, and a drive pulley 62 is arranged near the lower end portion. An endless belt 63 is looped between the driven pulley 61 and the drive pulley 62. The convey base 40 of the arm section 34 is connected to the endless belt 63 through a belt clamp 64. In addition, the drive pulley 62 is attached to a drive shaft 65a of a motor 65 fixed on the bottom surface of the cylindrical support member 33.

A pair of parallel guide rails 66 and 67 are vertically arranged on the left and right end portion in the vertical wall portion 31. A pair of horizontal support members 68 and 69 extend from the side surface of the convey base 40, and sliders 70 and 71 are engaged with the end portions of the horizontal support members 68 and 69 such that the sliders 70 and 71 can be slid on both the guide rails 66 and 67. When the vertical belt drive mechanism and vertical slide mechanism described above are used, the arm section 34 can be vertically moved in the Z-axis direction.

Figure 10:
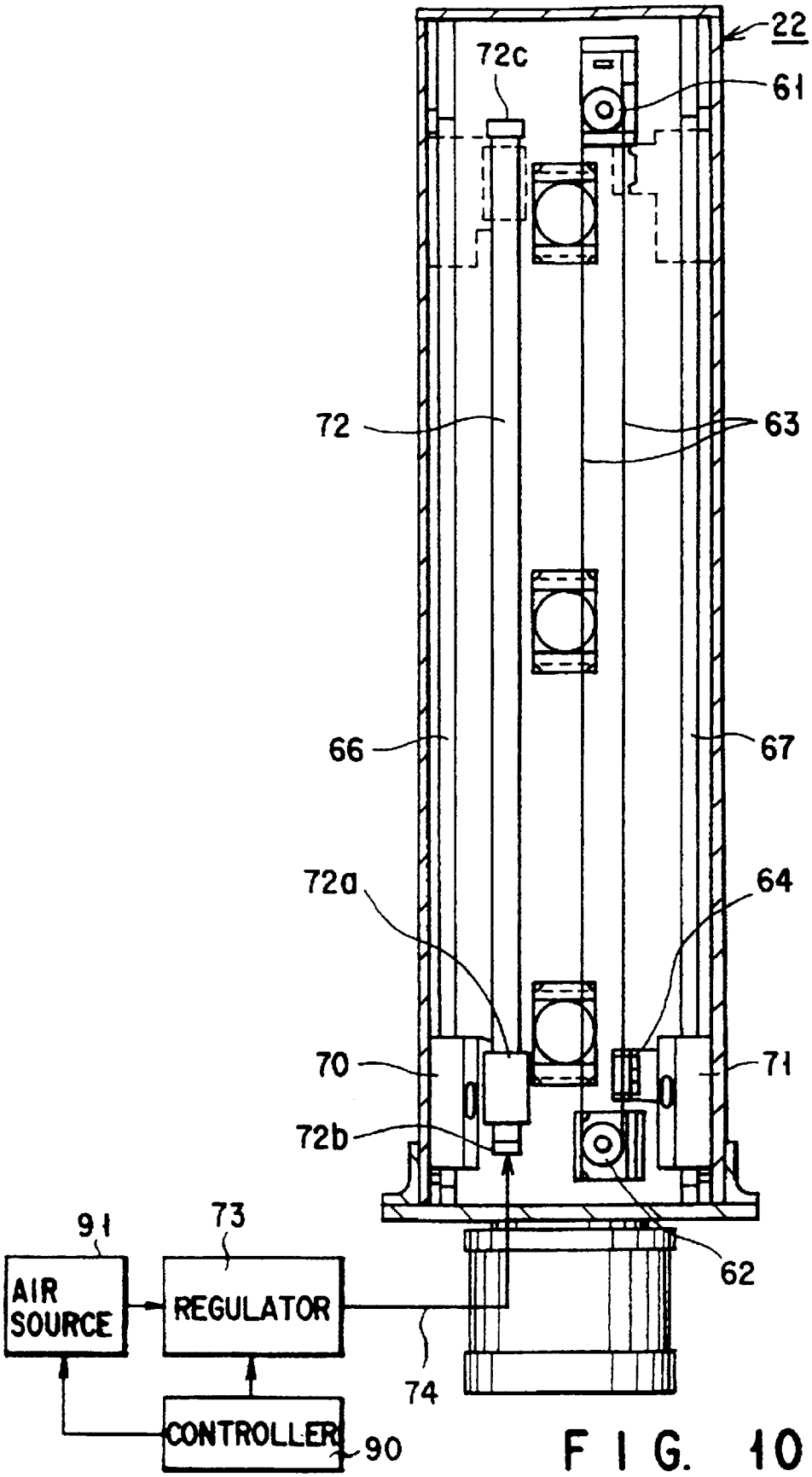
FIG. 10 is a block sectional view showing the main handler when viewed in a side direction.

As shown in FIG. 10, a rodless cylinder 72 is vertically arranged between the central portion in the vertical wall portion 31 and the guide rail 66. An almost cylindrical mobile portion 72a is slidably arranged on the rodless cylinder 72, the mobile portion 72a is connected to the convey base 40 of the arm section 34 through the horizontal support member 68. This mobile portion 72a is magnetically coupled to the piston (not shown) of the rodless cylinder 72, and the arm section 34 and the piston are designed to be simultaneously moved through the mobile portion 72a.

A board 72b is attached to the lower end of the rodless cylinder 72. Compressed air having a pressure at which a force almost equal to the weight of the arm section 34 is generated by the piston is supplied to the board 72b. This compressed air is supplied from an sir source 91 to the board 72b through a regulator 73 and a pipe 74. Note that the board 72c on the upper end of the rodless cylinder 72 is open-air. In addition the sir source 91 and the regulator 73 are controlled by the controller 90.

Since the weight of the arm section 34 is canceled by the operation of the rodless cylinder 72, the arm section 34 can be moved upward at a high speed. Even if the endless belt 63 for driving is cut, the arm section 34 is kept at its position by dynamic lift from the rodless cylinder 72, and the arm section 34 does not fall due to its weight. Therefore, the arm section 34 and the cylindrical support member 33 are not damaged.

Each drive mechanism is operated and controlled by the controller 90. The controller 90 can also rotate the main handler 22 at the angle θ while the arm section 34 is moved in the Z-axis direction. In addition, the controller 90 can advance/retreat the holding arms 41, 42, and 43.

Processes for a wafer W in the resist coating/developing process system 1 will be briefly described below.

The first sub-handler 21 accesses the cassette CR in the cassette station 10, and then picks one of unprocessed wafers W from the cassette CR. The first sub-handler 21 moves to the alignment unit (ALIM) arranged in the third process unit group $G_3$ on the process section 11 side, and then transfers the wafer W into the alignment unit (ALIM).

When orientation flat alignment and centering of the wafer W is completed in the alignment unit (ALIM), the arm section 34 of the main handler 22 receives the wafer whose alignment is completed, moves it to a position in front of the adhesion unit (AD) located under the alignment unit (ALIM) in the third process unit group $G_3$, and then loads the wafer W into the adhesion unit. The wafer W is loaded into the cooling unit (COL) belonging to the stacked units of the third process unit group $G_3$ or the fourth process unit group $G_4$. The wafer W is cooled to, e.g., 23° C., in the cooling unit (COL).

The cooling process is completed, the main handler 22 causes the first holding arm 41 to unload the wafer W from the cooling unit (COL), exchanges the wafer W for the next wafer W held by the second holding arm 42, and loads the cooled wafer W into the resist coating unit (COT) belonging to the stacked units of the first process unit group $G_1$ or the second process unit group $G_2$. In this resist coating unit (COT), a resist solution is coated on the wafer surface by a spin coating method to have a uniform thickness.

When the resist coating process is completed, the main handler 22 unloads the wafer from the resist coating unit (COT), and loads it into the prebaking unit (PREBAKE). In the prebaking unit (PREBAKE), the wafer W is heated at, e.g., 10° C., for a predetermined time, and the residual solvent is evaporated and removed from the coated film on the wafer W.

Upon completion of the prebaking process, the main handler 22 unloads the wafer from the prebaking unit (PREBAKE), and loads it into the extension/cooling unit (EXTCOL) belonging to the stacked units of the fourth process unit group $G_4$. In this extension/cooling unit (EXTCOL), the wafer is cooled to a temperature, e.g., 24° C., suitable for the next step, i.e., the peripheral exposure process in the peripheral exposure device 23. Upon completion of this cooling process, the main handler 22 conveys the wafer W into the extension unit (EXT) immediately above the extension/cooling unit (EXTCOL), and places the wafer W on a predetermined placing table (not shown) in the extension unit (EXT).

When the wafer W is placed on the placing table of the extension unit (EXT), the second sub-handler 24 accesses the wafer W from the opposite side to receive the wafer W. The second sub-handler 24 loads the wafer W into the peripheral exposure device 23 in the interface section 12. In this case, the peripheral portion of the wafer W receives the exposure process.

Upon completion of the peripheral exposure process, the second sub-handler 24 unloads the wafer W from the peripheral exposure device 23, and transfers the wafer W onto a wafer receiving table (not shown) on the exposure device adjacent to the peripheral exposure device 23. In this case, before the wafer is received by the exposure device, the wafer may be temporarily stored in the buffer BR as needed.

Upon completion of entire pattern exposure process in the exposure device, when the wafer W is returned onto the wafer receiving table on the exposure device, the second sub-handler 24 accesses the wafer receiving table to receive the wafer subjected to the exposure process, and loads the wafer W into the extension unit (EXT) belonging to the fourth process unit group $G_4$. Note that, in this case, before the wafer W is given to the process section 11, the wafer W may be temporarily stored in the buffer cassette BR in the interface section 12.

When the wafer W is loaded in the extension unit (EXT), the main handler 22 accesses the wafer W from the opposite side to receive the wafer W, and loads the wafer W into the developing unit (DEV) belonging to the first process unit group $G_1$ or the second process unit group $G_2$. In this developing unit (DEV), the wafer W is placed on the pin chuck, and a developing solution is uniformly poured on the resist on the wafer surface. When the developed, exposed resist at the peripheral portion of the wafer are completely removed, a rinse solution is poured on the wafer surface to remove the developing solution.

Upon completion of the developing step, the main handler 22 unloads the wafer W from the developing unit (DEV), and loads the wafer W into the post-baking unit (POBAKE) belonging to the third process unit group $G_3$ and the fourth process unit group $G_4$. In this post-baking unit (POBAKE), the wafer W is heated at, e.g., 100° C., for a predetermined time.

Upon completion of the post-baking process, the main handler 22 unloads the wafer W from the post-baking unit (POBAKE), and loads the wafer into one of the cooling unit (COL). In this case, after the temperature of the wafer W returns to room temperature, the main handler 22 conveys the wafer W into the extension unit (EXT) belonging to the third process unit group $G_3$.

When the wafer W is placed on a placing table (not shown) in the extension unit (EXT), the first sub-handler 21 accesses the wafer W from the opposite side to receive the wafer W. The first sub-handler 21 loads the received wafer W into the a predetermined slot of the cassette CR on the cassette placing table 20.

Throughout the resist coating and developing processes described above, the main handler 22 operates most frequently. The above wafer convey operations are continuously repeated, these processes are simultaneously performed. Therefore, the main handler 22 is reciprocated without an interval between the process units in the process section 11 to convey the wafer W. For this reason, in order to increase the throughput, it is necessary that the main handler 22 is rapidly and smoothly operated. In consideration of this point, the main handler 22 having the arm section 34 according to this embodiment performs the following convey operation.

For convey between the units, as shown in FIG. 2, the arm section 34 must horizontally convey the wafer W serving as a substrate to be processes between the five unit groups $G_1$ to $G_5$ surrounding the main handler 22.

Since each of the process unit groups $G_1$ to $G_5$, as shown in FIGS. 3 and 4, constitutes a multi-stage unit structure, the arm section 34 always performs θ rotation and upward moving in the Z-axis direction. In the wafer loading/unloading port of each process unit, the holding arms 41, 42, and 43 are advanced and retreated to perform transfer and exchange of the wafers.

Since the main handler can be rotated at the angle θ while the arm section 34 moves in the Z-axis direction, various convey processes described in (1) to (3) described below.

(1) Both Z-axis direction moving/θ rotation are started, and both the Z-axis direction moving/θ rotation are completed.

(2) Z-axis direction moving is started, θ rotation is started, and both the Z-axis direction moving/θ rotation are completed.

(3) θ rotation is started, Z-axis direction moving is started, and both the Z-axis direction moving/θ rotation are completed.

As a matter of course, in the above moving processes, the Z-axis direction moving/θ rotation need not be completed at once, the following stopping procedures can be employed. That is, the θ rotation is completed upon completion of the Z-axis direction moving, or the Z-axis direction moving is completed upon completion of the θ rotation. In any case, the start of moving and the completion of moving are preferably set depending on the moving distance in the Z-axis direction and the angle θ of the rotation.

When the parallel operation of Z-axis direction moving/θ rotation using the above multi-axis synchronous drive operation is employed, a load on the mechanism can be reduced, and a moving operation can be performed quicker and smoother than a conventional moving operation without excessively increasing the speed of each drive system.

In addition, before the Z-axis direction moving and θ rotation are completed, a necessary one of the holding arms 41, 42, and 43 can be advanced in advance.

Note that the allowable area of moving of the holding arms 41, 42, and 43 to be advanced/treated is an area except for an interference area in which the holding arms 41, 42, and 43 adversely affect various equipments or devices in each process unit. In other words, the area is an area in which the holding arms 41, 42, and 43 do not affect the various equipments and devices in their physical conditions or process performance.

The arm section 34 has the sensor 52, the sensor 52 can simultaneously detect the presence/absence of the held wafer and the protruding portion of the held wafer while the main handler 22 is moved, and can quickly perform these checking operations before the wafer is loaded into the process units. For this reason, a trouble can be prevented, uniformity of a process in each process unit can be assured.

When a processed wafer is exchanged for an unprocessed wafer, the following procedures are performed.

(a) Advance of a no-load holding arm is started, and the advance is completed.

(b) The processed wafer is received.

(c) Retreat of the holding arm which receives the processed wafer is started, and retreat of the holding arm is completed.

(d) Advance of a holding arm which holds an unprocessed wafer is started, and the advance is completed.

(e) The unprocessed wafer is given to a process unit.

(f) Retreat of the no-load arm is started, and the retreat is completed.

In the method according to this embodiment, when a processed wafer is exchanged for an unprocessed wafer, operations of the holding arms 41, 42, and 43 are controlled by the following procedures.

(1) Advance of the no-load holding arm 41 is started, and the advance is completed.

(2) The processed wafer is received.

(3) Retreat of the holding arm 41 which receives the processed wafer is started, and advance of the holding arm 42 which holds an unprocessed wafer is started.

(4) Retreat of the holding arm 41 which receives the processed wafer is completed, the advance of the second holding arm 42 which holds the unprocessed wafer is completed.

(5) The unprocessed wafer is given to a process unit.

(6) Retreat of the no-load holding arm 42 is started, and the retreat is completed.

In the steps (3) and (4), operations of the two holding arms 41 and 42 overlap. Therefore, a time required for the exchange process is shorter in the method of this embodiment than in a conventional method.

The above exchange process described above and a wafer detection operation can be parallelly performed. An operation in the adhesion unit (AD) arranged in the third process unit group $G_3$ will be exemplified below.

Figure 11:
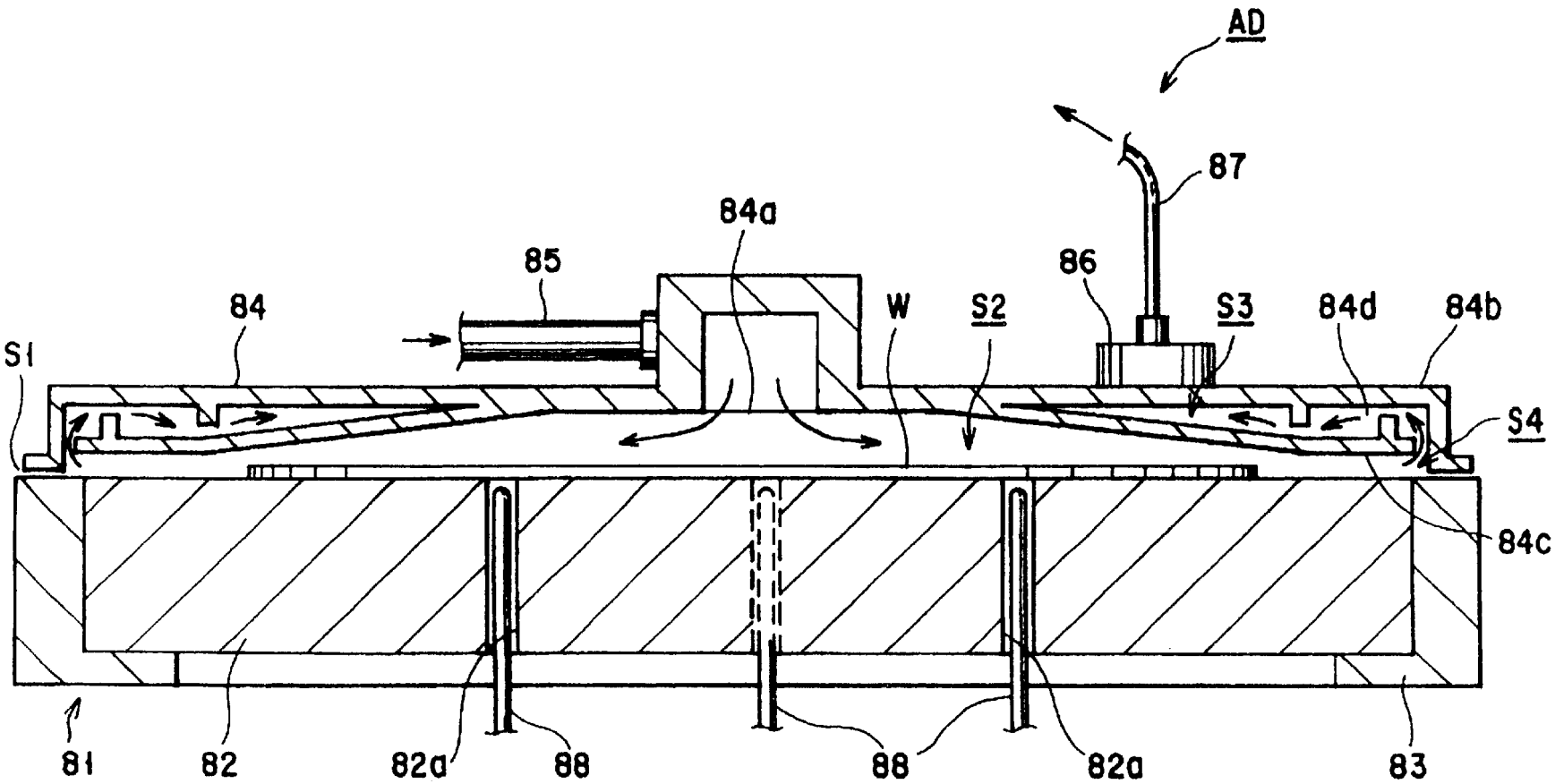
FIG. 11 is a sectional view showing an adhesion unit serving as one of process chambers.
Figure 12A:
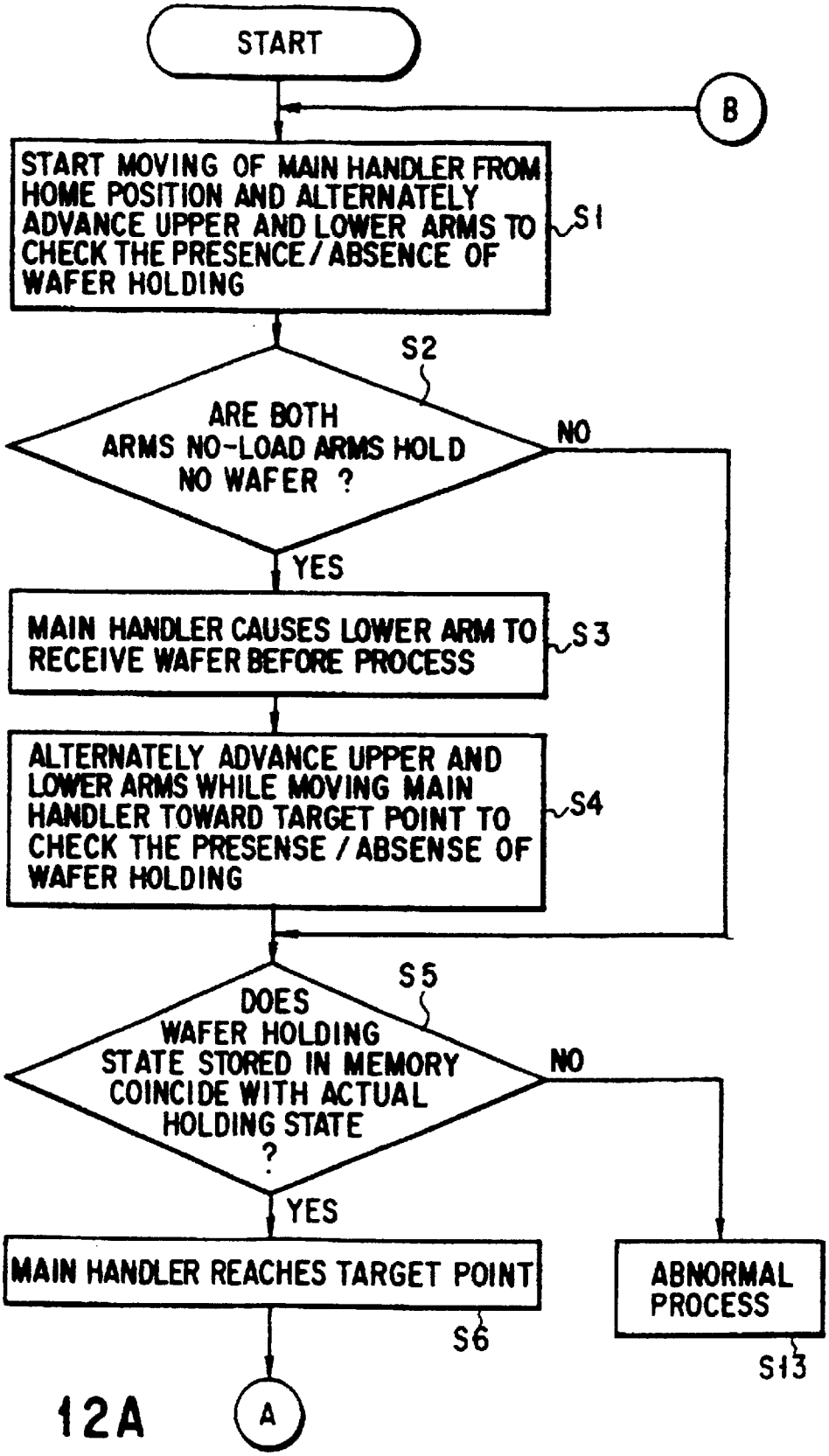
FIGS. 12A and 12B are flow charts showing wafer convey procedures when resist coating/developing processes are performed to a wafer, respectively.
Figure 12B:
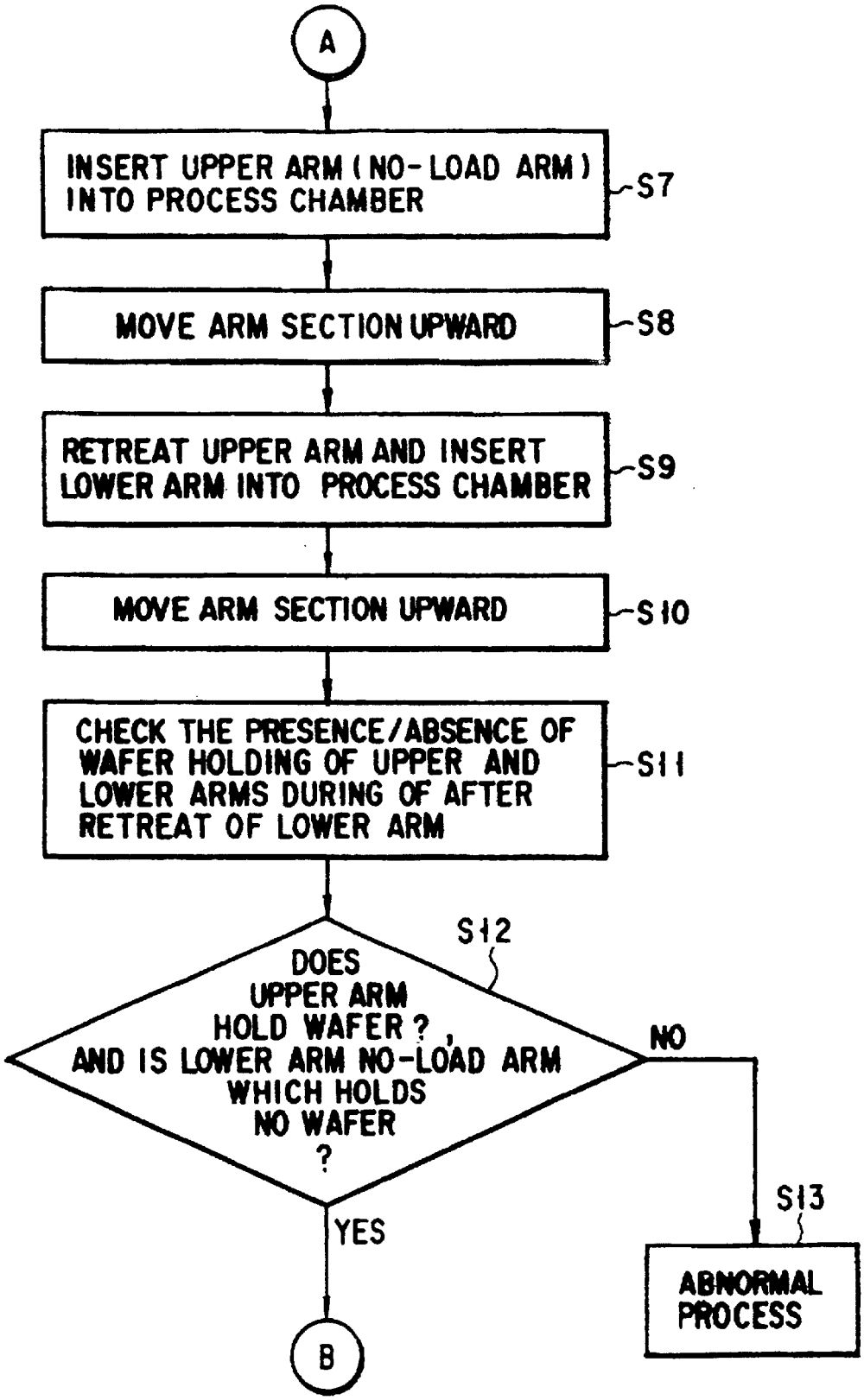

FIG. 11 is a sectional view showing the main portion of the adhesion unit (AD). A process vessel 81 of the adhesion unit (AD) has a disk-like heating table (mounting table) 82, a cylindrical heating plate holding member 83, and a lid 84. The lid 84 covers the upper portion of the heating table 82 through a gap $S_1$ and a space $S_2$. A gas supply port 84a is formed in the central portion of the lid 84, and an HMDS (hexamethyldisilazane) gas is supplied from the gas supply port 84a into the process vessel 81 through a gas supply pipe 85.

The lid 84 has a double-lid structure having an upper lid 84b and a lower lid portion 84c which are vertically divided by two to form a hollow portion $S_3$ having a sectional area which gradually increases from a portion near the gas supply port 84a to the outside of the lid 84 in the radial direction. A gap $S_4$ is formed almost throughout the periphery between the peripheral portion of the upper lid 84b and the inner side wall of the lower lid portion 84c. A draft portion 84d is formed almost throughout the periphery in the connection portion between the upper lid 84b and the lower lid portion 84c. A gap 84e between the upper lid 84b and the lower lid portion 84c communicates with an exhaust port 86 formed in the outer side surface of the lid 84. In this manner, the HMDS gas supplied from the gas supply port 84a is uniformly diffused toward the periphery in the space $S_2$, and is uniformly exhausted via the gap $S_4$. The exhaust port 86 is connected to an exhaust pump (not shown) through an exhaust pipe 87.

The heating table 82 consists of, e.g., aluminum, and a wafer W is placed on the heating table 82. A heater and a temperature sensor are incorporated in the heating table 82. Three through holes 82a are formed in the heating table 82, and vertically movable support pins 88 used for exchanging wafers are inserted into the through holes 82a. When the wafer is loaded/unloaded, the support pins 88 project (move) upward from the upper surface of the heating table 82 to carry the wafer W. In this manner, wafers W are exchanged between the holding arms 41, 42, and 43 of the main handler 22.

In the adhesion unit (AD) having the above arrangement, the HMDS gas is supplied into the process vessel 81 while the process vessel 81 is evacuated in advance. The HMDS gas reacts to the wafer W while the wafer is heated to improve the fixing and adhering properties of the resist with respect to the wafer surface. Note that the processed gas is exhausted from the exhaust port 86 to the outside of the vessel through the gap $S_4$ and the draft portion 84d of the lid 84. Therefore, an $N_2$ gas is supplied from a gas supply pipe 85 into the vessel to perform $N_2$ gas purging.

Wafer exchanges before and after the adhesion process will be exemplified with reference to FIGS. 12A and 12B and FIGS. 13A to 13I.

Figure 13A:
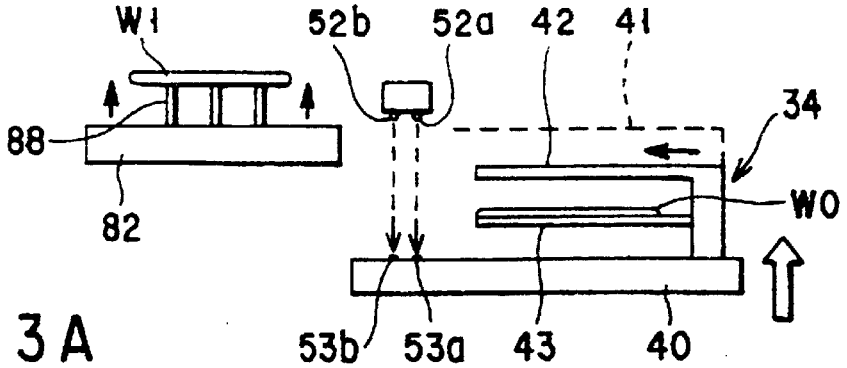
FIGS. 13A, 13B, 13C, 13D, 13E, 13F, 13G, 13H, and 13I are views for explaining operations performed when a wafer is loaded/unloaded into/from a process chamber by the main handler, respectively.
Figure 13B:
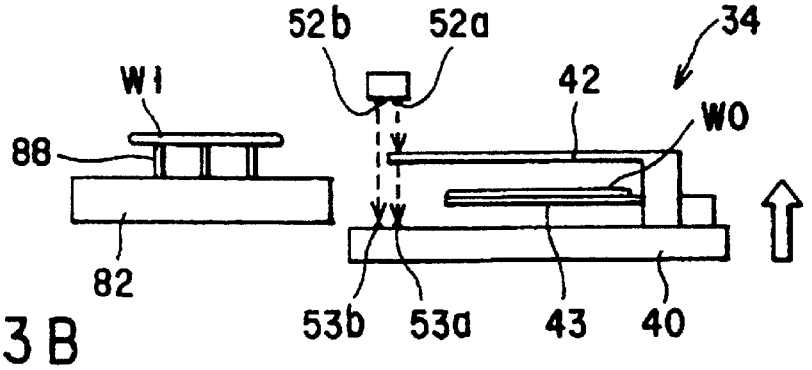

Assume that the main handler 22 is at a homo position first. Moving of the main handler 22 is started from the homo position, and, as shown in FIG. 13B, the second holding arm 42 and the third holding arm 43 are alternately advanced to check the presence/absence of wafer holding (step S1). Note that the first holding arm 41 at the uppermost portion is not used when the wafer W is loaded/unloaded into/from the adhesion unit (AD). For this reason, the first holding arm 41 is omitted in FIGS. 13A to 13I.

The controller 90 checks on the basis of a detection signal from the sensor 52 whether both the arms 42 and 43 are no-load arms which hold no wafer W (step S2). If YES in step S2, the main handler 22 causes the third holding arm 43 to receive an unprocessed wafer W (step S3). If NO in step S2, the flow jumps to the step S5 (to be described later). In this case, unprocessed wafers W include not only an unprocessed wafer in the cassette station 10 but also wafers in the other process units. Note that the support pins 88 move upward from the heating plate 82 in the vessel of the adhesion unit (AD) to carry a processed wafer $W_1$, thereby easily receiving the wafer $W_1$ by the holding arm.

While the main handler 22 moves toward the adhesion unit (AD) serving as a target point, the second holding arm 42 and the holding arms 41, 42, and 43 are alternately advanced to check the presence/absence of wafer holding (step S4). Note that when the unit for the previous process and the adhesion unit (AD) belong to different process unit groups, respectively, the main handler 22 is rotated at the angle θ while the arm section 34 is moved in the Z-axis direction.

The controller 90 checks whether a wafer holding state stored in a memory coincides with actual wafer holding states in the arms 42 and 43 (step S5).

While the arm section 34 moves in the Z-axis direction, as shown in FIG. 13B, the second holding arm 42 advances to a predetermined detection position, and detection beams are emitted from the two light-emitting portions 52a and 52b of the sensor 52. At this time, when the holding arm 42 is a no-load arm, both the light-receiving portions 53a and 53b receives the beams. For this reason, it is confirmed in advance that the holding arm 42 is set in a receivable state. If one of the light-receiving portions 53a and 53b receives a beam, it is determined that the second holding arm 42 is not set in a receivable state, and the sequential operations are stopped. At the same time, this may be displayed on an external device, e.g., a monitor.

Figure 13C:
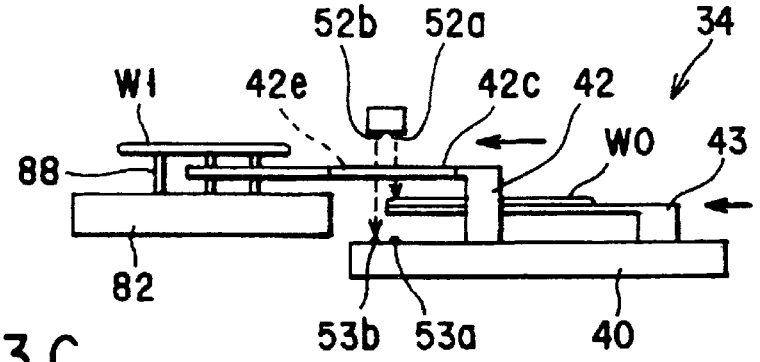

Thereafter, the second holding arm 42 which holds an unprocessed wafer $W_0$ advances to a predetermined detection position, the two light-emitting portions 52a and 52b emit detection beams. As shown in FIG. 13c, a support member 42c of the second holding arm 42 is located above a holding member 43b of the third holding arm 43 to cover the holding member 43b. However, since a long hole 42c is formed in the second holding arm 42, the detection beam can reaches the front edge portion of the third holding arm 43 and the light-receiving portions 53a and 53b through the long hole 42e. Therefore, the detection operation is not adversely affected by the second holding arm 42.

When only the light-receiving portion 53b receives the detection beam, and the light-receiving portion 53a does not receive the detection beam, it is determined that the third holding arm 43 holds the wafer $W_0$. At this time, if both the light-receiving portions 53a and 53b do not receive the detection beam, it is determined that the third holding arm 43 does not hold the wafer $W_0$. On the other hand, when both the light-receiving portions 53a and 53b receive the detection beams, it is determined that the holding position of the wafer $W_0$ sticks out of a predetermined position.

If YES in step S5, the main handler 22 is caused to reach the adhesion unit (AD) serving as the target point (step S6). If NO in step S5, it is determined that abnormality occurs to perform an abnormal process (step S13). In this abnormal process, the main handler 22 is returned to the home position first, and an operator confirms the actual states of the holding arms 42 and 43. After the cause of the abnormality is removed, the operator pushes a reset button to return the control to a normal process.

Figure 13D:
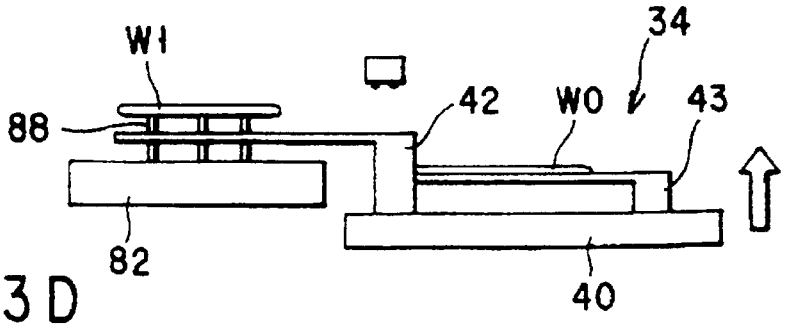
Figure 13E:
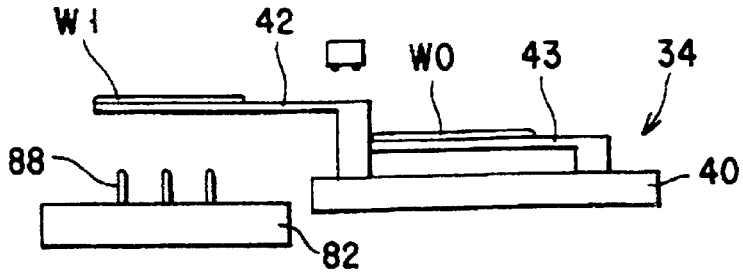

Moving of the main handler 22 is stopped, and, as shown in FIG. 13D, the second holding arm 42 serving as a no-load arm is inserted into the adhesion unit (AD) (step S7). When the arm section 34 is moved upward, as shown in FIG. 13E, the processed wafer $W_1$ is transferred to the second holding arm 42 (step S8).

Figure 13F:
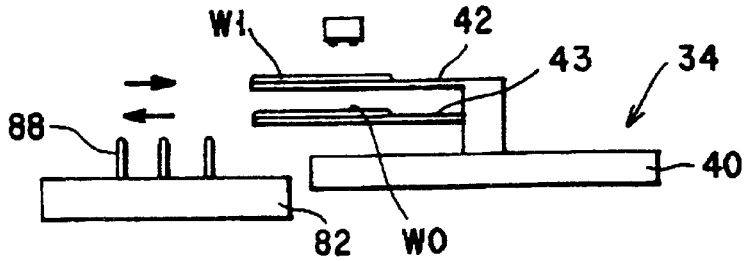
Figure 13G:
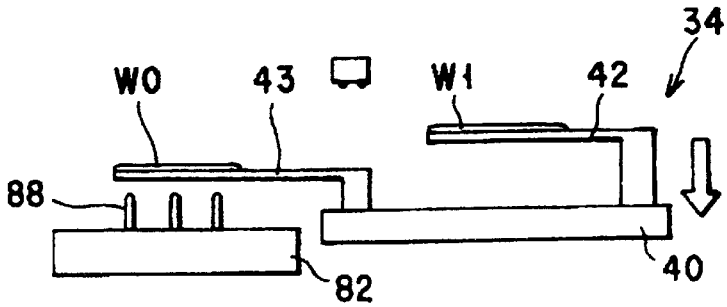
Figure 13H:
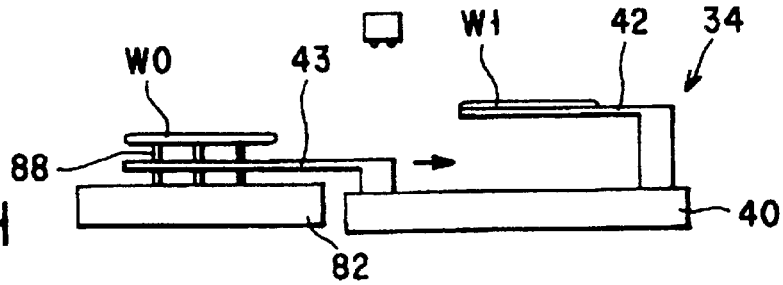
Figure 13I:
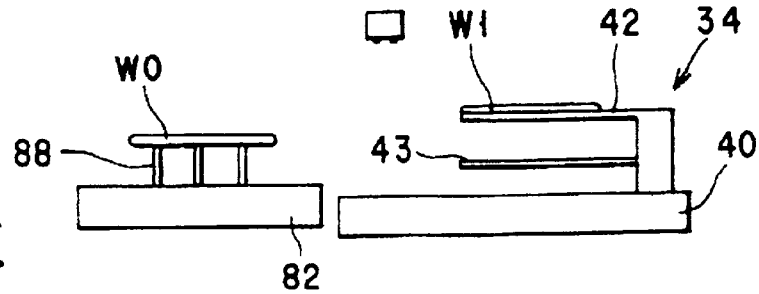

As shown in FIGS. 13F and 13G, the second holding arm 42 is retreated from the adhesion unit (AD), and the third holding arm 43 is inserted into the adhesion unit (AD) (step S9). When the arm section 34 is moved downward, as shown in FIGS. 13H and 13I, the unprocessed wafer $W_0$ is transferred from the third holding arm 43 to the support pins 88.

The second holding arm 42 and the third holding arm 43 are alternately advanced during or after retreat of the third holding arm 43 to check the presence/absence of wafer holding (step S11). The controller 90 checks whether the second holding arm 42 holds the processed wafer $W_1$, and whether the third holding arm 43 is a no-load arm which holds no wafer (step S12). If YES in step S12, the main handler 22 is returned to the home position, or the main handler 22 is moved toward the cooling unit (COL) in which the next step is to be executed (step S1). If NO in step S12, it is determined that abnormality occurs to perform an abnormal process (step S13).

The semiconductor wafer is exemplified in the above embodiment. However, according to the present invention, an LCD substrate, a CD substrate, a photomask, various printed boards, or a ceramic substrate can also be processed.

According to the apparatus of the present invention, a convey operation can be performed at a speed higher than that of a conventional convey operation without an excessive load acting on the drive system, and a throughput can be increased with suppressing particle generation.

Until holding arms are in the interference areas of process units in which substrates are to be processed, the holding arms are simultaneously advanced/retreated into/from the process units. For this reason, the moving time of the overall convey device required to load/unload the substrate in/from the processing apparatus can be further shortened.

Since the presence/absence of substrate holding can be confirmed in an early stage before a substrate is loaded into the processing apparatus, a trouble related to substrate holding can be detected in the early stage. Therefore, a time required to perform such detection can be made shorter than that of a case wherein this detection is performed when the convey operation is stopped.

A time required to exchange a processed substrate for an unprocessed substrate and insert the unprocessed substrate into the process unit can be made shorter than that of the prior art. In addition, a trouble related to substrate holding in an exchange operation can be detected in advance.

The second embodiment of the present invention will be described below with reference to FIGS. 14 to 18E. The same reference numerals as in the first embodiment denote the same parts in the second embodiment, and a description thereof will be omitted.

In an apparatus according to the second embodiment, an acceleration acting on a main handler 222 is controlled depending on the moving distance to a target point. In addition, the wafer contact/holding portion of a third holding arm 241 consists of a material having a high friction coefficient to cope with control of the acceleration of the main handler 222.

An arm section 34 of the main handler 222 comprises a first holding arm 243, a second holding arm 242, and the third holding arm 241 which are sequentially arranged from below. Of these holding arms, the lower two holding arms 243 and 242 are the same as those of the first embodiment.

Figure 16:
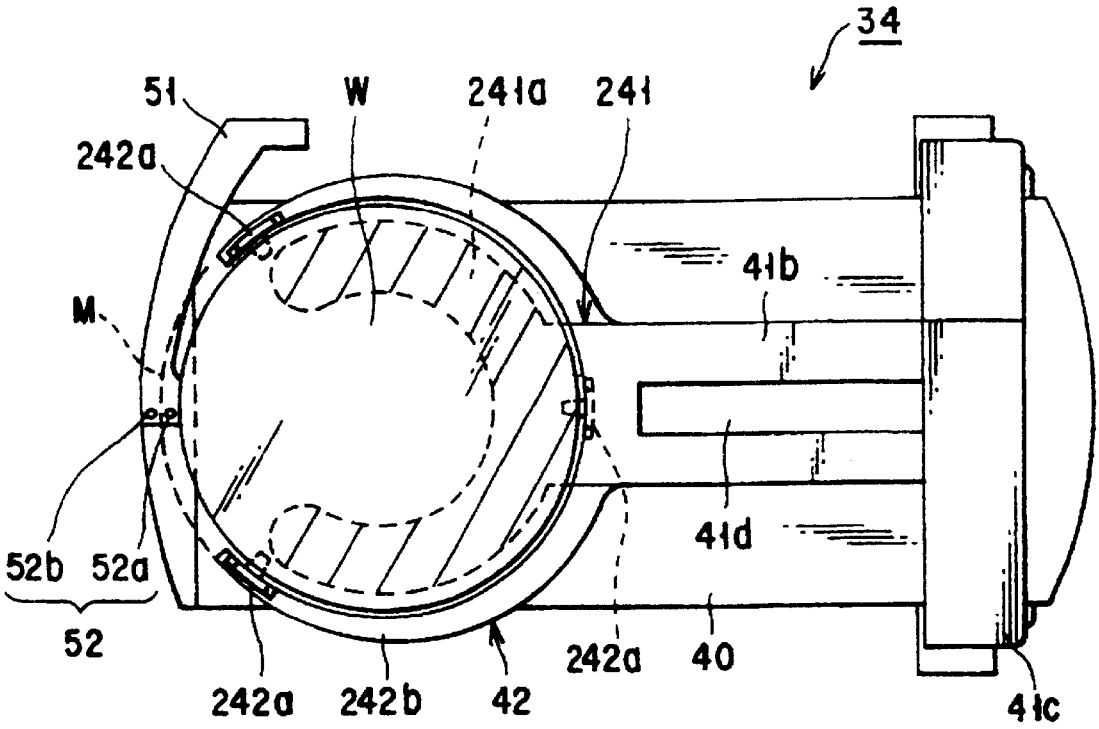
FIG. 16 is a plan view showing an arm section of the main handler.
Figure 17:
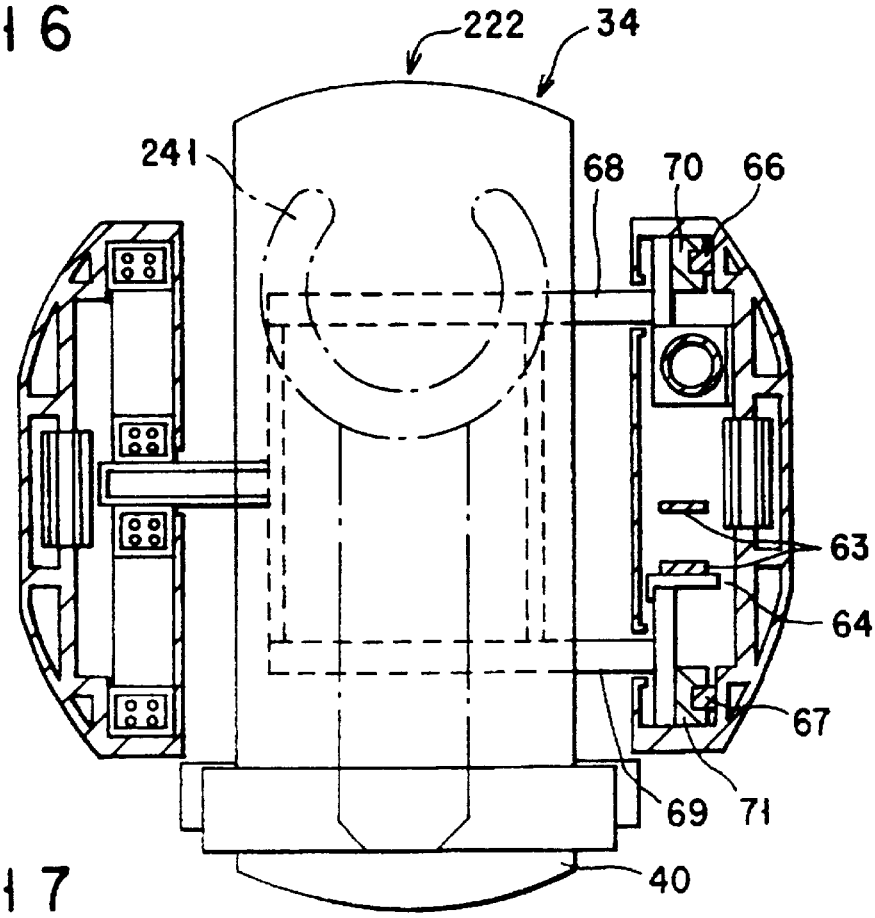
FIG. 17 is a sectional view showing a drive mechanism of the arm section of the main handler.

The third holding arm 241 at the uppermost portion, as shown in FIGS. 16 and 17, comprises a holding member 241a having a flat almost C-character shape, and a support member 241b for supporting the holding member 241a. As shown in FIG. 16, when a wafer W is held and conveyed by the third holding arm 241, only the lower surface of the wafer W is brought into contact with the holding member 241a, and is supported thereby. More specifically, the outer diameter of the holding member 241a of the third holding arm 241 is smaller than the outer diameter of the wafer W to be conveyed.

The inner diameter of the holding member 241a of the third holding arm 241 is larger than the contact portion between the wafer W and a spin chuck in a resist coating unit (COT) or a developing unit (DEV).

The width of the notched opening in the front end of the holding member 241a is set to be larger than the outer diameter of the spin chuck. Therefore, the holding member 241a of the third holding arm 241 is brought into contact with the lower surface of the wafer W in a hatched area in FIG. 16. When the third holding arm 241 is formed to have the above shape, the third holding arm 241 is not brought into contact with the spin chuck or support pins 88 when the wafer W is loaded/unloaded into/from a process unit.

In the third holding arm 241, at least the upper surface of the holding member 241a consists of a material having a high friction coefficient, e.g., a rubber-based material. The frictional force between the holding member 241a and the wafer W is increased, a positional error can be prevented when the wafer conveyed.

In addition, the upper surface of the holding member 241a has heat resistance to stand heat of, e.g., 100° C. or more, and preferably consists of a material which generates a small amount of particle.

In this embodiment, the entire upper surface of the holding member 241a is in contact with the lower surface of the wafer W. However, a plurality of projections (not shown) may be formed on the upper surface of the holding member 241a to support the wafer W. Note that the material of the holding member 241a itself except for its upper surface may be, e.g., ceramic.

When a stay 241c arranged on the support member 241b is slid by a drive motor (not shown), the third holding arm 241 is moved as a whole in the front and rear directions of a convey base 240.

A long hole 41d having an almost rectangular shape, for forming an opening along the longitudinal direction of the support member 241b, i.e., the moving direction of the third holding arm 241 is formed in the support member 241b. Sensor light-emitting portions 52a and 52b are located on the line extending from the front of the long hole 41d in the longitudinal direction.

In this embodiment, the accelerations and decelerations of Z-axis direction moving of the arm section 34 and θ rotation of the main handler 22 can be changed depending on the distance between the process units.

Figure 14:
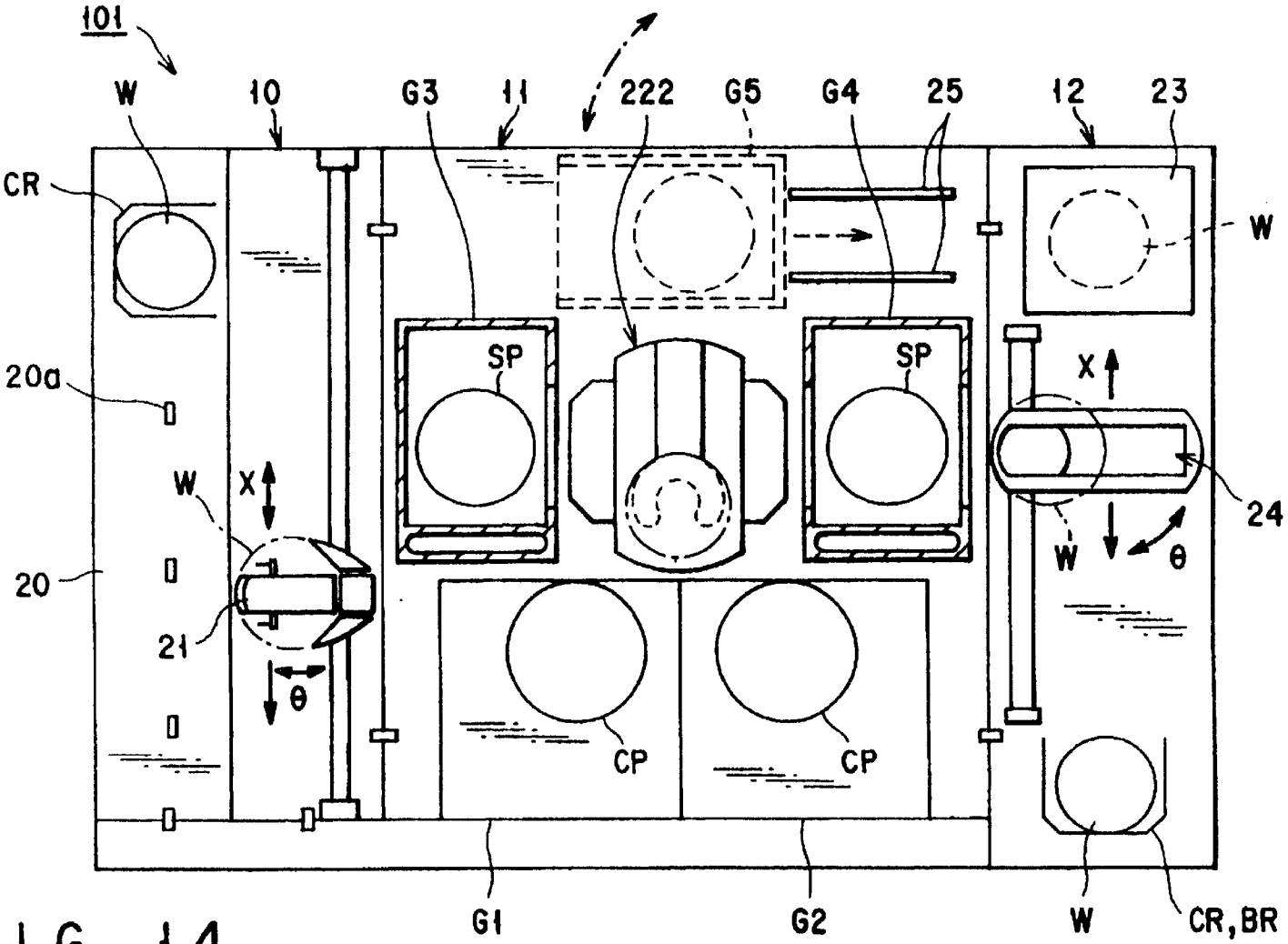
FIG. 14 is a plan layout view showing a resist processing apparatus according to the second embodiment of the present invention.
Figure 15:
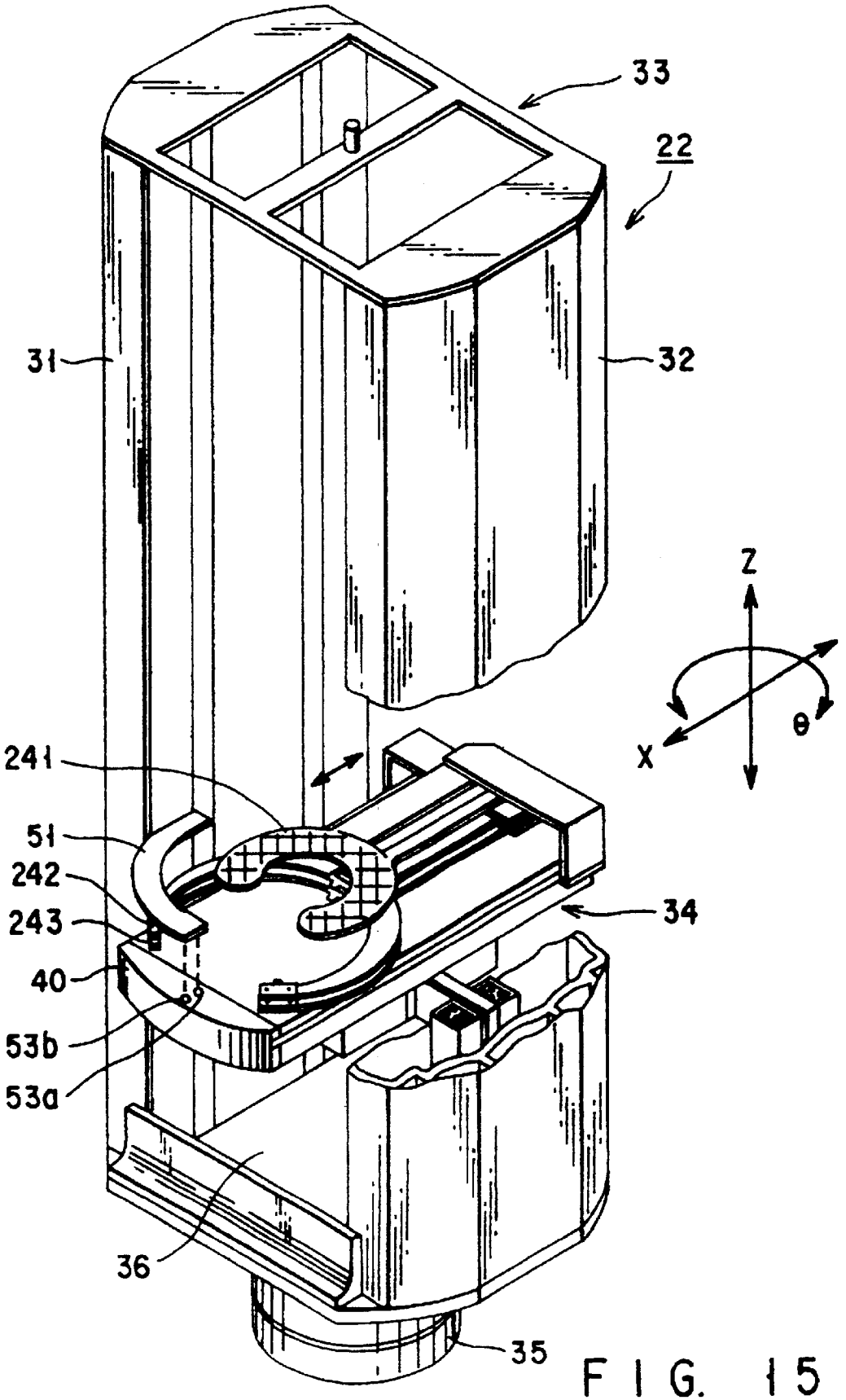
FIG. 15 is a partially cutaway perspective view showing a main handler.

For example, as shown in FIG. 14, the moving distance of the arm section 34 when the arm section 34 moves from a third process unit group $G_3$ to a second process unit group $G_2$ is longer than the moving distance of the arm section 34 when the arm section 34 moves from a first process unit group $G_1$ to the third process unit group $G_3$.

In this case, the acceleration and deceleration of the arm section 34 when the arm section 34 moves from the first process unit group $G_1$ to the third process unit group $G_3$ are set to be smaller than the acceleration and deceleration of the arm section 34 when the arm section 34 moves from the third process unit group $G_3$ to the second process unit group $G_2$. In this manner, an instantaneous excessive change in torque acting on the motor 35 is suppressed, and vibration is suppressed. A moving state wherein the arm section 34 is suddenly stopped as soon as the arm section 34 suddenly advances can be avoided. Therefore, vibration to the wafers held by the holding arms 241, 242, and 243 can be suppressed, and preferable holding states can be realized.

The numerical values of the acceleration and deceleration are calculated in advance depending on the convey distance between the process units, and the controller 90 determines the numerical values on the basis of a moving distance according to an actual process to change the acceleration and deceleration.

After a resist solution is coated on the wafer W, the wafer W is loaded into a prebaking unit (PREBAKE) in which a heating process in the next step is performed. In this case, when the coated resist solution is a resist solution having a high viscosity, e.g., a polyimide-based resist solution, even if a side rinse process is performed in a resist coating unit (COT), polyimide on the wafer periphery is not easily removed. Therefore, the wafer W is conveyed from the resist coating unit (COT) to the prebaking unit (PREBAKE), the resist solution must be prevented from being attached to the holding member for contact-holding the wafer W.

In consideration of this point, in the arm section 34 according to this embodiment comprises the third holding arm 241 for supporting only the central side of the lower surface of the wafer W. For this reason, when the wafer W on which the resist solution is coated is picked from the resist coating unit (COT) and conveyed into the prebaking unit (PREBAKE), the wafer W is held by the holding member 241a of the third holding arm 241. In this case, the process solution such as the resist solution on the peripheral portion is not attached to the third holding arm 241.

When the wafer W is to be conveyed by using the third holding arm 241, the wafer W is conveyed such that the wafer W is placed on the holding member 241a and held by a frictional force. For this reason, in advance/retreat of the third holding arm 241, more specifically, unloading from the resist coating unit (COT), loading into the prebaking unit (PREBAKE), Z-axis direction moving, and θ rotation, their speeds are desirably set to be lower than those in another convey operation.

In this embodiment, a holding member for placing and holding a wafer W is only the third holding arm 241. However, two or more holding members for placing and holding wafers W may be arranged. For example, when two third holding arms 241 are arranged, the present invention can cope with a case wherein a so-called multi-stage heating process must be performed after a resist solution is coated.

A resist is not completely hardened by one (primary) heating process, and a heating process (secondary) at a higher temperature is continuously performed again. In this case, when it is still undesirable that the lower edge of the periphery of the wafer W is directly held when the primary heating process is completed, a holding member (holding arm) for placing and holding a wafer W is short in an exchange of wafers W in the next heating process unit. Therefore, when a holding arm having the same arrangement as that of the third holding arm 241 is arranged as the fourth arm, the present invention can cope with the multi-stage heating process.

The above description relates to control of an acceleration and a deceleration when the wafer W is conveyed between the process units, and selection of a convey means. However, when a vertical moving speed of the arm section 34 in exchanges of the wafers between the process units is controlled, an yield can be increased.

A case wherein a wafer W is loaded into the adhesion unit (AD) having the above arrangement, and the wafer W held by the holding arm 242 is transferred onto the support pins 88 will be described below with reference to FIGS. 18A to 18E. Note that each arrow in FIGS. 18A to 18E indicates a moving speed. That is, a speed indicated by two arrows is higher than a speed indicated by one arrow.

Figure 18A:
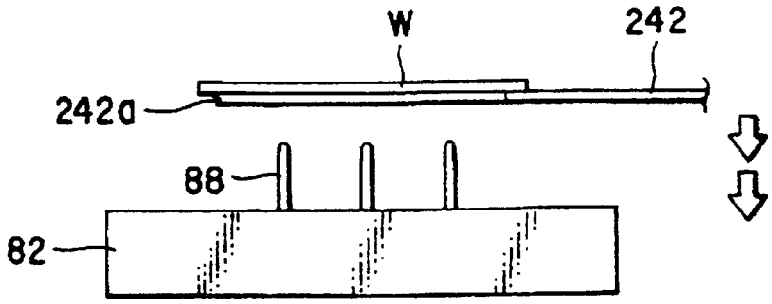
FIGS. 18A, 18B, 18C, 18D, and 18E are views for explaining operations performed when a wafer is loaded/unloaded into/from a process chamber by the main handler, respectively.

As shown in FIG. 18A, after the holding arm 242 which holds a wafer W advances to the downward moving start position of the holding arm 242 in the adhesion unit (AD), the arm section 34 as a whole is moved downward at a relatively high speed at first.

Figure 18B:
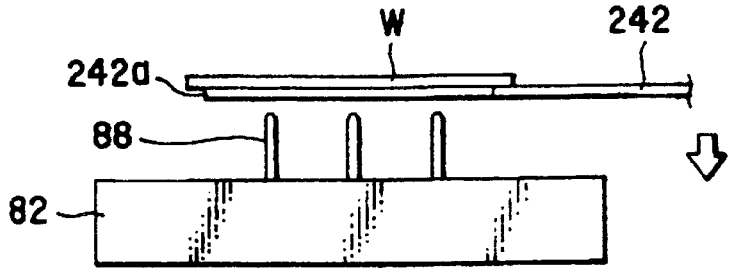
Figure 18C:
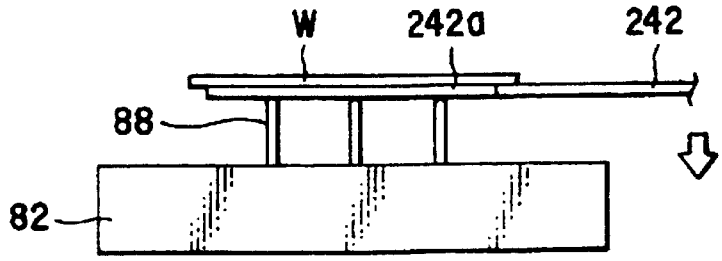
Figure 18D:
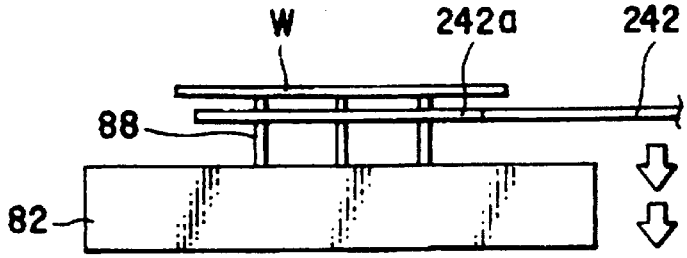
Figure 18E:
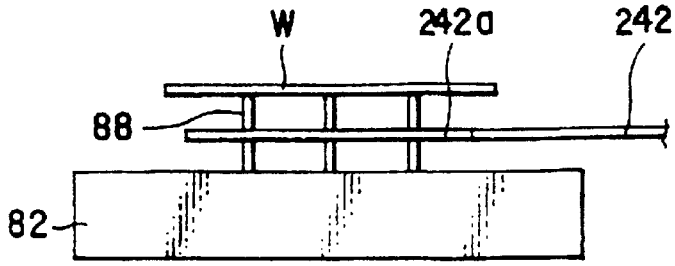

When the wafer W held by the holding member 242a of the holding arm 242, as shown FIG. 18B, moves upward from the heating plate 82 of the adhesion unit (AD) to become close to the top portions of the support pins 88 which is standby for carriage, the downward moving speed is switched, and the wafer is moved downward at a relatively low speed. As shown in FIG. 18C, the wafer W is still moved downward at a relatively low speed even when the lower surface of the wafer W is brought into contact with the top portions of the support pins 88. In addition, as shown in FIG. 18D, the wafer W is carried on the support pins 88, and the wafer W is kept moved downward at the relatively low speed until the holding member 242a of the holding arm 242 reaches a position slightly separated from the top portions of the support pins 88. Therefore, the downward moving speed is switched to a relatively high speed. Subsequently, as shown in FIG. 18E, the wafer is kept moved downward at the relatively high speed until the holding arm 242 moves downward to a downward point. After the holding arm 242 reaches the predetermined downward point, the holding arm 242 is retreated.

As described above, the downward moving speeds of the holding arm 242 (arm section 34) are switched to each other. For this reason, since the lower surface of the wafer W is brought into contact with the top portions of the support pins 88 at a relatively low speed when the wafer W is carried by the support pins 88, the shock is small. Therefore, abnormal noise is not generated, and a positional error of the wafer W does not occur. In addition, a total transfer time is not considerably long.

Upon completion of the adhesion process, when the processed wafer W is received by, e.g., the holding arm 242, the holding arm 242 (arm section 34) is preferably moved upward such that the speed switching operations are performed by the procedures reverse to the above procedures. As these speeds, proper speeds are calculated by an experiment or the like in advance. The speeds are automatically selected from the proper speeds to perform variable control of the speeds.

Note that control of a vertical moving speed in an exchange of wafers W by the arm section 34 can be applied to not only an exchange of wafers between the arm section 34 and a unit having the support pins 88 but also an exchange of wafers between the arm section 34 and another process unit having a spin chuck, e.g., the resist coating unit (COT).

According to the method of the present invention, since an acceleration in a convey operation is changed depending on a moving distance, an acceleration and a deceleration are increased when the moving distance to the target point to convey a wafer at a high speed, and the wafer can be caused to reach the target point within a short time. On the other hand, when the moving distance to the target point is short, the acceleration and deceleration are decreased to convey a wafer at a low speed, and vibration in a convey operation can be suppressed.

According to the present invention, contamination caused by attaching of a process solution or the like and a high-speed convey operation can be realized with a good balance.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate processing apparatus for performing a plurality of processes to a substrate comprising:

a common path[, extending in a Y-axis direction,] in which one substrate or a plurality of substrates are conveyed;

a plurality of process units stacked on [both sides of] said common path to constitute multi-stage structures *and surrounding said common path*;

a main handler [moved in said common path in the Y-axis direction and] rotated about a Z axis at an angle θ to load/unload the substrate into/from said process units;

an arm section arranged to move in said main handler in the Z-axis direction;

a plurality of holding arms arranged in said arm section to constitute a multi-stage structure so as to respectively hold the substrates, each holding arm being advanced and retreated on an X-Y plane from said arm section, and wherein one holding arm of said plurality of holding arms is located at a position higher than that of another holding arm of said plurality of holding arms, [said one holding arm having a portion which is brought into direct contact with a substrate, said portion being made of a material of a friction coefficient higher than that of a material of a non-contact portion];

detection means, arranged in said arm section, for detecting a holding state of the substrate held in each of said plurality of holding arms; and control means for controlling an operation of said main handler, an operation of said arm section, and operations of said plurality of holding arms on the basis of a detection result from said detection means *wherein said control means moves the arm section in a Z-axis direction while rotating the main handler about a Z axis at an angle* θ;

wherein said control means advances or retreats each holding arm while operating at least one of said main handler and said arm section, and causes said detection means to detect the holding state of the substrate held by each holding arm before said holding arm reaches a corresponding one of said process units.

2. An apparatus according to claim 1, wherein said control means advances and retreats each holding arm while at least one of said main handler and said arm section operates, and until said holding arm intrudes into an interference area in which said holding arm physically interferes with the process unit.

3. An apparatus according to claim 1, wherein said detection means comprises an optical sensor having an optical axis in the Z-axis direction, and when the holding arm which holds the substrate is advanced, said held substrate crosses the optical axis to shield a detection beam, thereby detecting said held substrate.

4. An apparatus according to claim 3, further comprising a support member for supporting one of said holding arms, wherein said support member is formed with an opening through which said detection beam passes, and wherein said holding arms are arranged in said arm section such that said holding arms can be independently advanced or retreated, and said control means operates said holding arms such that an advance period of one holding arm overlaps a retreat period of another holding arm, and detects the detection beam passing through the opening during this operation.

5. An apparatus according to claim 1, wherein each process unit comprises an opening facing toward said common path and a mounting table which the substrate is mounted on, said holding arm is advanced [in the X-axis direction] to load the substrate into said process unit through said opening, and said arm section is moved downward in the Z-axis direction to transfer the substrate onto said mounting table, and said arm section is moved upward in the Z-axis direction to lift the substrate from said mounting table, and said holding arm is retreated [in the X-axis direction] to pick the substrate from said process unit through said opening.

6. An apparatus according to claim 1, further comprising a sub-handler for receiving the substrate from said main handler, and for transferring the substrate to said main handler.

7. An apparatus according to claim 1, wherein said detection means comprises a light-emitting portion arranged above said holding arms and a light-receiving portion arranged below said holding arms.

8. An apparatus according to claim 1, wherein said arm section has first and second arms each having a first holding member for holding a peripheral portion of the substrate to be processed, and a third arm having a section holding member which is brought into contact with only a lower surface of the substrate to be processed.

9. An apparatus according to claim 1, wherein said control means comprises arithmetic means for calculating moving distances of said main handler and arm section, and accelerations used when said main handler and said arm section are moved are increased/decreased depending on a moving distance of the main handler and a moving distance of the arm section calculated by said arithmetic means.

10. An apparatus according to claim 1, wherein said control means decreases a downward moving speed of said arm section when the substrate is transferred from each holding arm onto said mounting table in a corresponding one of said process units.

11. A substrate processing method comprising the steps of:

(a) a step of loading a substrate from a cassette station into a process section;

(b) a step of causing a holding arm to hold the substrate, *and rotating the substrate about a Z axis at an angle* θ, *and simultaneously* moving the substrate in a [Y-axis direction along a common path in said process section, moving the substrate in a] Z-axis direction[, and rotating the substrate about a Z axis at an angle θ];

(c) a step of loading the substrate into a process unit;

(d) a step of unloading the processed substrate from said process unit; and (e) a step of unloading the substrate from said process section to said cassette station;

wherein said step of loading the substrate into a process unit and said step of unloading the processed substrate from said process unit are performed simultaneously.

12. A method according to claim 11, wherein, in the step (b), a holding state of the substrate by said holding arm is changed depending on a type of a process in one process unit, and a convey speed used when the substrate is conveyed from said process unit to another process unit is changed.

13. A method according to claim 11, wherein, in the step (c), said holding arm is advanced [to an X-axis direction] to load the substrate into said process unit through an opening, and an arm section is moved downward in the Z-axis direction to transfer the substrate onto a mounting table in the process unit, and said arm section is moved upward in the Z-axis direction to lift the substrate from said mounting table, and said holding arm is retreated [in the X-axis direction] to pick the substrate from said process unit through said opening.

14. A method according to claim 11, wherein, in the step (b), an acceleration and a deceleration used when the substrate is moved is changed depending on a moving distance of the substrate.

15. A method according to claim 11, wherein, in the step (c), a downward moving speed of said arm section is decreased when the substrate is transferred from said holding arm onto a mounting table in said process unit.

16. A substrate processing apparatus for performing a plurality of processes to a substrate comprising:

a common path[, extending in a Y-axis direction,] in which one substrate or a plurality of substrates are conveyed;

a plurality of process units stacked on [both sides of] said common path to constitute multi-state structures *and surrounding said common path*;

a main handler [moved in said common path in the Y-axis direction and] rotated about a z axis at an angle θ to load/unload the substrate into/from said process units;

an arm section arranged in said main handler, having an ascending/descending mechanism for moving said arm section in a Z-axis direction, said ascending/descending mechanism further including a slider connected to said arm portion, a guide rail for guiding the slider in the Z-axis direction, a belt to which the slider is attached, a driving pulley and a driven pulley between which the belt is looped, a hollow rodless cylinder arranged in parallel with the guide rail, and an upward moving force applying means for supplying a compressed gas into a lower end of the rodless cylinder to apply an upward force to the rodless cylinder;

a plurality of holding arms arranged in said arm section to constitute a multi-stage structure so as to respectively hold the substrates, each holding arm being advanced and retreated on an X-Y plane from said arm section;

detecting means, arranged in said arm section, for detecting a holding state of the substrate held in each of said plurality of holding arms; and control means for controlling an operation of said main handler, an operation of said arm section, and operations of said plurality of holding arms on the basis of a detection result from said detection means *wherein said control means moves the arm section in a Z-axis direction while rotating the main handler about a Z axis at an angle* θ, wherein said control means advances or retreats each holding arm while operating at least one of said main handler and said arm section, and causes said detection means to detect the holding state of the substrate held by each holding arm before said holding arm reaches a corresponding one of said process units.

* * * * *